(12) United States Patent
Kim et al.

(10) Patent No.: US 12,284,482 B2
(45) Date of Patent: Apr. 22, 2025

(54) VIBRATION APPARATUS AND APPARATUS INCLUDING THE SAME

(71) Applicant: LG Display Co., Ltd., Seoul (KR)

(72) Inventors: Minji Kim, Paju-si (KR); SeungRyull Park, Paju-si (KR); Chiwan Kim, Paju-si (KR); Yong-Su Ham, Paju-si (KR); Uihyeon Jeong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 215 days.

(21) Appl. No.: 17/966,539

(22) Filed: Oct. 14, 2022

(65) Prior Publication Data
US 2023/0217190 A1 Jul. 6, 2023

(30) Foreign Application Priority Data
Dec. 31, 2021 (KR) ........................ 10-2021-0194790

(51) Int. Cl.
| | | |
|---|---|---|
| *H04R 17/00* | (2006.01) | |
| *B06B 1/06* | (2006.01) | |
| *H10N 30/20* | (2023.01) | |
| *H10N 30/50* | (2023.01) | |

(52) U.S. Cl.
CPC ......... *H04R 17/005* (2013.01); *B06B 1/0622* (2013.01); *H10N 30/204* (2023.02); *H10N 30/50* (2023.02)

(58) Field of Classification Search
CPC ...... H04R 17/005; H04R 31/006; H04R 1/06; H04R 7/04; H04R 17/00; H04R 2499/15; H04R 9/06; H04R 9/02; H04R 2400/11; H04R 7/045; H04R 2499/13; B06B 1/0622; H10N 30/204; H10N 30/50; H05K 7/20963
See application file for complete search history.

(56) References Cited

U.S. PATENT DOCUMENTS

| | | | |
|---|---|---|---|
| 2004/0183407 A1* | 9/2004 | Takeshima | H04R 17/00 310/331 |
| 2021/0304920 A1 | 9/2021 | Ko et al. | |

FOREIGN PATENT DOCUMENTS

| | | | | |
|---|---|---|---|---|
| DE | 3402657 A1 | 8/1985 | | |
| JP | 3043347 U | 11/1997 | | |
| KR | 20060119632 A | * 11/2006 | ......... | H05K 7/20963 |

* cited by examiner

*Primary Examiner* — Angelica M McKinney
(74) *Attorney, Agent, or Firm* — Birch, Stewart, Kolasch & Birch, LLP

(57) ABSTRACT

A vibration apparatus can include a first cover member; a second cover member; a vibration portion between the first cover member and the second cover member; a contact portion between the first cover member and the vibration portion; and a signal cable. The signal cable can include a first signal line connected to a first surface of the vibration portion via the contact portion, and a second signal line connected to a second surface of the vibration portion opposite to the first surface of the vibration portion.

35 Claims, 12 Drawing Sheets

VIBRATION APPARATUS AND APPARATUS INCLUDING THE SAME

CROSS-REFERENCE TO RELATED APPLICATIONS

This application claims priority to the Korean Patent Application No. 10-2021-0194790 filed in the Republic of Korea, on Dec. 31, 2021, the entirety of which is hereby incorporated by reference.

BACKGROUND

Technical Field

The present disclosure relates to a vibration apparatus and an apparatus including the same.

Discussion of the Related Art

Recently, the need for slimming and thinning electronic devices is increasing. Also, as speakers applied to electronic devices and the like need to be slim and thin, instead of using large speaker coils, piezoelectric elements capable of realizing a thin thickness are attracting much attention.

Speakers or vibration apparatuses with a piezoelectric element applied thereto can be driven or vibrated by a driving power or a driving signal supplied through a signal cable.

General vibration apparatuses (or film actuators) include a film which includes a pad electrode and a line for applying a driving power to a piezoelectric element. The general vibration apparatuses need a process of patterning the line and the pad electrode on the film and a soldering process of electrically connecting the pad electrode to a signal cable. However, the soldering process for various elements within the vibration apparatuses can cause the design and manufacture to become complicated and costly, and thicker. Also, due to the vibrating nature of vibration apparatuses, a vibration film actuator can become disconnected from a corresponding signal cable, especially when they are connected by solder bonding.

SUMMARY OF THE DISCLOSURE

The inventors have performed various experiments for implementing a vibration apparatus in which a manufacturing process and a structure of the vibration apparatus can be simplified. Through the various experiments, the inventors have invented a vibration apparatus having a new structure and an apparatus including the same, in which a manufacturing process and a structure of the vibration apparatus can be simplified.

An aspect of the present disclosure is directed to providing a vibration apparatus and an apparatus including the same, in which a manufacturing process and a structure of the vibration apparatus can be simplified. Also, an aspect of the present disclosure is directed to providing a vibrating portion that can be more securely adhered to a corresponding signal cable with an elegant design that can reduce the thickness of the vibration apparatus, extend the lifespan of the vibration apparatus, increase the volume of sound output by the vibration apparatus, improve sound quality and fidelity, and simplify the manufacturing process.

Another aspect of the present disclosure is directed to providing a vibration apparatus and an apparatus including the same, in which a reduction in sound characteristic can be minimized despite using an electrode having a high surface resistance.

Additional features and aspects will be set forth in part in the description that follows, and in part will become apparent from the description, or can be learned by practice of the inventive concepts provided herein. Other features and aspects of the inventive concepts can be realized and attained by the structure particularly pointed out in the written description, or derivable therefrom, and the claims hereof as well as the appended drawings.

To achieve these and other aspects of the present disclosure, as embodied and broadly described herein, a vibration apparatus includes a first cover member, a second cover member, a vibration portion between the first cover member and the second cover member, a contact portion between the first cover member and the vibration portion, and a signal cable including a first signal line connected to the a surface of the vibration portion and a second signal line connected to a second surface of the vibration portion opposite to the first surface of the vibration portion.

In another aspect of the present disclosure, an apparatus includes a passive vibration member, and a vibration generating apparatus connected to the passive vibration member to vibrate the passive vibration member, the vibration generating apparatus can include a vibration apparatus, and the vibration apparatus can includes a first cover member, a second cover member, a vibration portion between the first cover member and the second cover member, a contact portion between the first cover member and the vibration portion, and a signal cable including a first signal line connected to the a surface of the vibration portion and a second signal line connected to a second surface of the vibration portion opposite to the first surface of the vibration portion.

According to an embodiment of the present disclosure, a vibration apparatus and an apparatus including the same, where a manufacturing process and a structure of the vibration apparatus can be simplified, can be provided.

According to an embodiment of the present disclosure, a vibration apparatus and an apparatus including the same, where a reduction in sound characteristic can be minimized despite using an electrode having a high surface resistance, can be provided.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

It is to be understood that both the foregoing general description and the following detailed description of the present disclosure are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects and embodiments of the disclosure and together with the description serve to explain principles of the disclosure.

Figure 1:
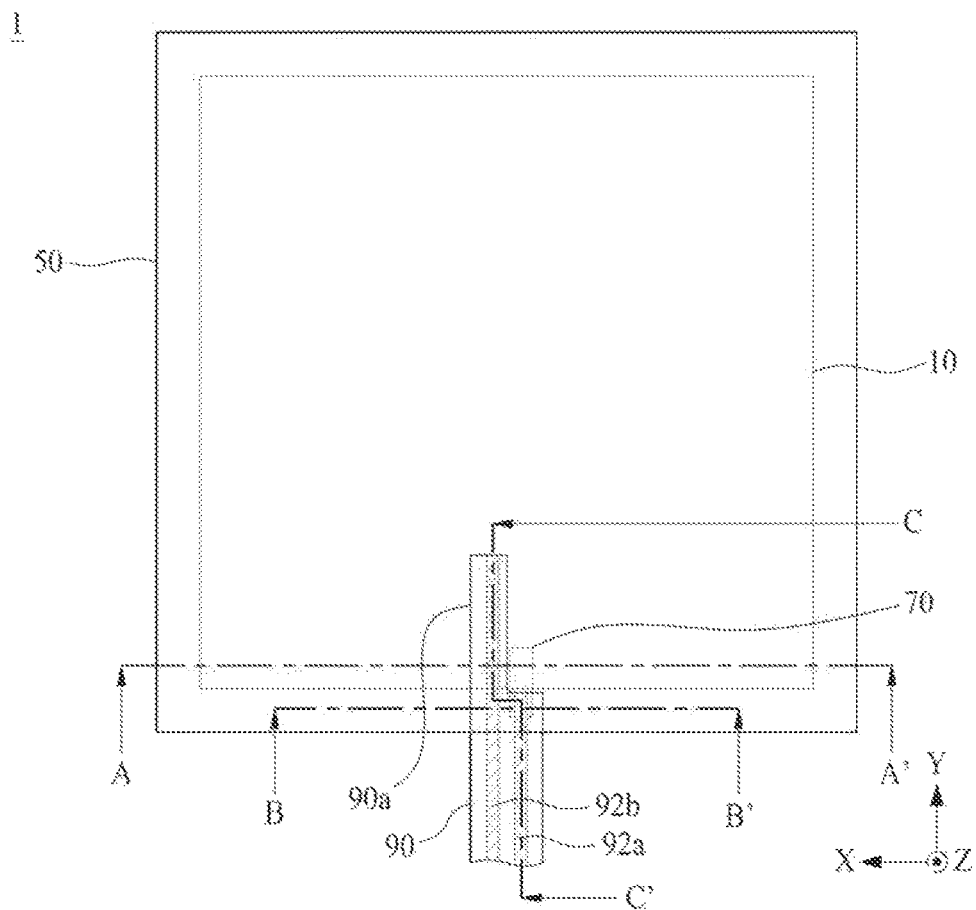
FIG. 1 illustrates a vibration apparatus according to an embodiment of the present disclosure.

Throughout the drawings and the detailed description, unless otherwise described, the same drawing reference numerals should be understood to refer to the same elements, features, and structures. The relative size and depiction of these elements can be exaggerated for clarity, illustration, and convenience.

DETAILED DESCRIPTION OF THE EMBODIMENTS

Reference will now be made in detail to embodiments of the present disclosure, examples of which can be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and can be changed as is known in the art, with the exception of steps and/or operations necessarily occurring in a particular order. Same reference numerals designate same elements throughout. Names of the respective elements used in the following explanations are selected only for convenience of writing the specification and can be thus different from those used in actual products.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and completely convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When the terms "comprise," "have," "include," "contain," "constitute," "make up of," "formed of," and the like are used, one or more other elements can be added unless the term, such as "only" is used. The terms of a singular form can include plural forms unless the context clearly indicates otherwise.

In construing an element, the element is construed as including an error or tolerance range even where no explicit description of such an error or tolerance range is provided.

In describing a position relationship, for example, when a position relation between two parts is described using "on," "over," "under," "above," "below," "beneath," "near," "close to," or "adjacent to," "beside," "next to," or the like, one or more other parts can be disposed between the two parts unless a more limiting term, such as ""immediate(ly)," "direct(ly)," or "close(ly)" is used. For example, when a structure is described as being positioned "on," "over," "under," "above," "below," "beneath," "near," "close to," or "adjacent to," "beside," or "next to" another structure, this description should be construed as including a case in which the structures contact each other as well as a case in which a third structure is disposed therebetween. For example, when a structure is described as being positioned "on," "over," "under," "above," "below," "beneath," "near," "close to," or "adjacent to," "beside," or "next to" another structure, this description should be construed as including a case in which the structures contact each other as well as a case in which a third structure is disposed or interposed therebetween. Furthermore, the terms "front," "rear," "left," "right," "top," "bottom, "downward," "upward," "upper," "lower," and the like refer to an arbitrary frame of reference.

In describing a time relationship, for example, when the temporal order is described "after," "subsequent," "next," "before," "prior to," or the like, a case that is not continuous can be included unless a more limiting term, such as "just," "immediate(ly)," or "direct(ly)" is used.

It will be understood that, although the terms "first," "second," etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc. can be used. These terms are intended to identify the corresponding elements from the other elements, and basis, order, or number of the corresponding elements should not be limited by these terms. The expression that an element is "connected," "coupled," or "adhered" to another element or layer means the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first items, a second item, and a third item" denotes the combination of all items proposed from two or more of the first item, the second item, and the third item as well as the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C.

In the present disclosure, the phrase "overlaps," "overlapping" and like phrases can be understood as "overlaps and electrically and/or physically connects e.g. by surface-to-surface contact," "overlapping and electrically and/or physically connecting e.g. by surface-to-surface contact."

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, embodiments of the present disclosure will be described in detail with reference to the accompanying drawings. Also, for convenience of description, a scale, size and thickness of each of elements illustrated in the accompanying drawings differs from a real scale, size and thickness, and thus, embodiments of the present disclosure are not limited to a scale, size and thickness illustrated in the drawings.

Figure 2:
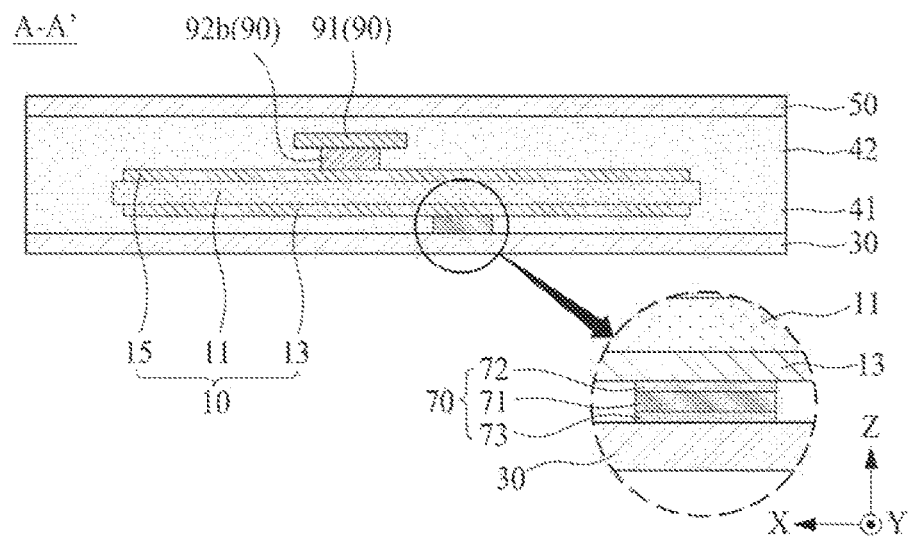
FIG. 2 is a cross-sectional view taken along line A-A' illustrated in FIG. 1 according to an embodiment of the present disclosure.
Figure 3:
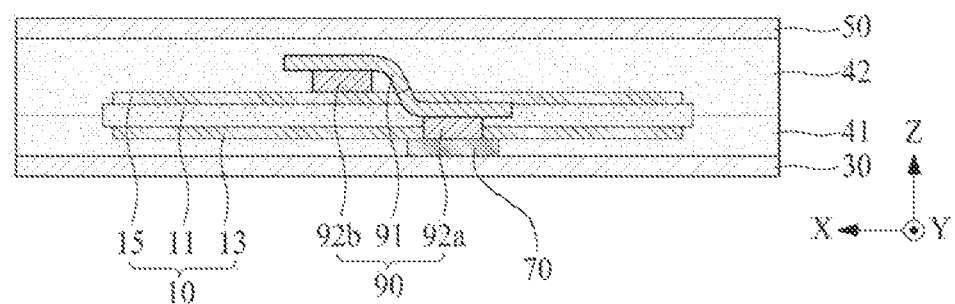
FIG. 3 is a cross-sectional view taken along line B-B' illustrated in FIG. 1 according to an embodiment of the present disclosure.
Figure 4:
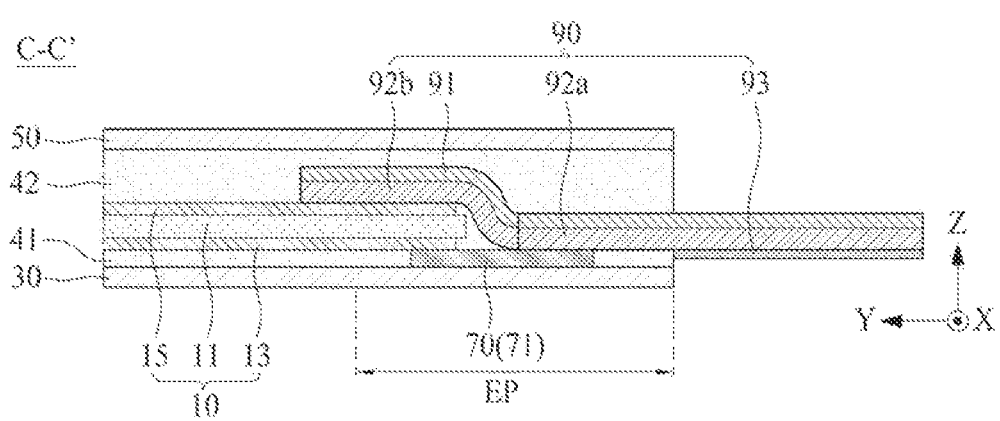
FIG. 4 is a cross-sectional view taken along line C-C' illustrated in FIG. 1 according to an embodiment of the present disclosure.

FIG. 1 illustrates a vibration apparatus 1 according to a first embodiment of the present disclosure. FIG. 2 is a cross-sectional view taken along line A-A' illustrated in FIG. 1. FIG. 3 is a cross-sectional view taken along line B-B' illustrated in FIG. 1. FIG. 4 is a cross-sectional view taken along line C-C' illustrated in FIG. 1.

With reference to FIGS. 1 to 4, the vibration apparatus 1 according to a first embodiment of the present disclosure can include a vibration portion 10, a first cover member 30, a second cover member 50, a contact portion 70, and a signal cable 90.

The vibration portion 10 can include a vibration layer 11, a first electrode layer 13, and a second electrode layer 15.

The vibration layer 11 can include a piezoelectric material (or an electroactive material) which includes a piezoelectric effect. For example, the piezoelectric material can have a characteristic in which, when pressure or twisting (or bending) is applied to a crystalline structure by an external force, a potential difference occurs due to dielectric polarization caused by a relative position change of a positive (+) ion and a negative (−) ion, and a vibration is generated by an electric field based on a reverse voltage applied thereto. The vibration layer 11 can be referred to as a piezoelectric layer, a piezoelectric material layer, an electroactive layer, a piezoelectric material portion, an electroactive portion, a piezoelectric structure, a piezoelectric composite layer, a piezoelectric composite, or a piezoelectric ceramic composite, or the like, but embodiments of the present disclosure are not limited thereto.

The vibration layer 11 can be configured as a ceramic-based material for generating a relatively high vibration, or can be configured as a piezoelectric ceramic having a perovskite-based crystalline structure. The perovskite crystalline structure can have a piezoelectric effect and an inverse piezoelectric effect, and can be a structure having orientation. The perovskite crystalline structure can be represented by a chemical formula "$ABO_3$". In the chemical formula, "A" can include a divalent metal element, and "B" can include a tetravalent metal element. For example, in the chemical formula "$ABO_3$," "A," and "B" can be cations, and "O" can be anions. For example, the chemical formula "$ABO_3$" can include at least one or more of lead (II) titanate ($PbTiO_3$), lead zirconate ($PbZrO_3$), lead zirconate titanate ($PbZrTiO_3$), barium titanate ($BaTiO_3$), and strontium titanate ($SrTiO_3$), but embodiments of the present disclosure are not limited thereto.

When the perovskite crystalline structure includes a center ion (for example, $PbTiO_3$), a position of a titanium (Ti) ion can be changed by an external stress or a magnetic field. Thus, polarization can be changed, thereby generating a piezoelectric effect. For example, in the perovskite crystalline structure, a cubic shape corresponding to a symmetric structure can be changed to a tetragonal (e.g., quadrilateral), orthorhombic, or rhombohedral structure corresponding to an unsymmetric structure, and thus, a piezoelectric effect can be generated. In a tetragonal (e.g., quadrilateral), orthorhombic, or rhombohedral structure corresponding to an unsymmetric structure, polarization can be high in a morphotropic phase boundary, and realignment of polarization can be easy, whereby the perovskite crystalline structure can have a high piezoelectric characteristic.

The vibration layer 11 according to another embodiment of the present disclosure can include one or more of lead (Pb), zirconium (Zr), titanium (Ti), zinc (Zn), nickel (Ni), and niobium (Nb), but embodiments of the present disclosure are not limited thereto.

The vibration layer 11 according to another embodiment of the present disclosure can include a lead zirconate titanate (PZT)-based material, including lead (Pb), zirconium (Zr), and titanium (Ti), or can include a lead zirconate nickel niobate (PZNN)-based material, including lead (Pb), zirconium (Zr), nickel (Ni), and niobium (Nb), but embodiments of the present disclosure are not limited thereto. Or, the vibration layer 11 can include at least one or more of calcium titanate ($CaTiO_3$), $BaTiO_3$, and $SrTiO_3$, each without lead (Pb), but embodiments of the present disclosure are not limited thereto.

The first electrode layer 13 can be disposed at a first surface (or a lower surface) of the vibration layer 11. The first electrode layer 13 can have the same size as the vibration layer 11, or can have a size which is smaller than the vibration layer 11. For example, the first electrode layer 13 can be formed on an entirety of the first surface, other than a periphery portion, of the vibration layer 11.

The second electrode layer 15 can be disposed at a second surface (or an upper surface) which is opposite to or different from the first surface of the vibration layer 11. The second electrode layer 15 can have the same size as the vibration layer 11, or can have a size which is smaller than the vibration layer 11. For example, the second electrode layer 15 can be formed on an entirety of the second surface, other than a periphery portion, of the vibration layer 11. The second electrode layer 15 can have the same shape as the vibration layer 11, but embodiments of the present disclosure are not limited thereto.

Each of the first electrode layer 13 and the second electrode layer 15 according to an embodiment of the present disclosure can include carbon, but embodiments of the present disclosure are not limited thereto. For example, one or more of the first electrode layer 13 and the second electrode layer 15 can be formed of a transparent conductive material, a semitransparent conductive material, or an opaque conductive material. For example, the transparent conductive material or the semitransparent conductive material can include indium tin oxide (ITO) or indium zinc oxide (IZO), but embodiments of the present disclosure are not limited thereto. The opaque conductive material can include gold (Au), silver (Ag), platinum (Pt), palladium (Pd), molybdenum (Mo), magnesium (Mg), or glass frit-containing silver (Ag), but embodiments of the present disclosure are not limited thereto. According to another embodiment of the present disclosure, in order to enhance an electrical characteristic and/or a vibration characteristic of the vibration layer 11, each of the first electrode layer 13 and the second electrode layer 15 can include Ag having a low resistivity. For example, carbon can be carbon black, ketjen black, carbon nanotube, and a carbon material including graphite, but embodiments of the present disclosure are not limited thereto.

The first cover member 30 can be disposed at a first surface of the vibration portion 10. For example, the first cover member 30 can be configured to cover the first electrode layer 13 of the vibration portion 10. Accordingly, the first cover member 30 can protect the first surface of the vibration portion 10 and the first electrode layer 13.

The second cover member 50 can be disposed at a second surface of the vibration portion 10. For example, the second cover member 50 can be configured to cover the second electrode layer 15 of the vibration portion 10. Accordingly, the second cover member 50 can protect the second surface of the vibration portion 10 and the second electrode layer 15.

The first cover member 30 and the second cover member 50 according to an embodiment of the present disclosure can each include one or more material of plastic, fiber, cloth, paper, leather, rubber, and wood, but embodiments of the present disclosure are not limited thereto. For example, each of the first cover member 30 and the second cover member 50 can include the same material or different material. For example, each of the first cover member 30 and the second cover member 50 can be a polyimide (PI) film or a polyethylene terephthalate (PET) film, but embodiments of the present disclosure are not limited thereto.

One or more of the first cover member 30 and the second cover member 50 according to an embodiment of the present disclosure can include an adhesive member. For example, one or more of the first cover member 30 and the second cover member 50 can include an adhesive member which is coupled to or attached on the vibration portion 10 and a protection member (or a stripping member) which covers or protects the adhesive member. For example, the adhesive member can include an electrical insulation material which has adhesive properties and is capable of compression and decompression. For example, the first cover member 30 can include an adhesive member which is coupled to or attached on the vibration portion 10 and a protection member (or a stripping member) which covers or protects the adhesive member.

The first cover member 30 can be connected or coupled to the first surface of the vibration portion 10 or the first electrode layer 13 by a first adhesive layer 41 as an example of the adhesive member mentioned above. For example, the first cover member 30 can be connected or coupled to the first surface of the vibration portion 10 or the first electrode layer 13 by a film laminating process using the first adhesive layer 41.

The second cover member 50 can be connected or coupled to the second surface of the vibration portion 10 or the second electrode layer 15 by a second adhesive layer 42 as an example of the adhesive member mentioned above. For example, the second cover member 50 can be connected or coupled to the second surface of the vibration portion 10 or the second electrode layer 15 by a film laminating process using the second adhesive layer 42.

Each of the first adhesive layer 41 and second adhesive layer 42 according to an embodiment of the present disclosure can include an electric insulating material which has adhesiveness and is capable of compression and decompression. For example, each of the first adhesive layer 41 and the second adhesive layer 42 can include an epoxy resin, an acrylic resin, a silicone resin, or a urethane resin, but embodiments of the present disclosure are not limited thereto.

The contact portion 70 can be disposed at one periphery portion EP of the first cover member 30 and can be electrically connected to the vibration portion 10. For example, a portion of the contact portion 70 can overlap or stack with a portion of the vibration portion 10. For example, a portion of the contact portion 70 can electrically contact a portion of the vibration portion 10. For example, a portion of the contact portion 70 can directly contact a portion of the vibration portion 10. For example, a first part of the contact portion 70 can overlap with a portion of the first electrode layer 13. For example, a first part of the contact portion 70 can be connected to a portion of the first electrode layer 13. For example, a portion of the contact portion 70 can electrically contact the first electrode layer 13 of the vibration portion 10. For example, half of the contact portion 70 can directly contact the first electrode layer 13 of the vibration portion 10. The other portion of the contact portion 70 can not overlap or stack with the vibration portion 10 and can be exposed at one periphery portion of the first cover member 30. For example, the contact portion 70 can be configured in an island shape at the one periphery portion EP of the first cover member 30 (e.g., about half of the contact portion 70 can stick out from under the vibration portion 10, similar to a tab type of structure).

The contact portion 70 can include a conductive double-sided adhesive member. The contact portion 70 can include a conductive double-sided tape, a conductive double-sided adhesive pad, or a conductive double-sided cushion tape, but embodiments of the present disclosure are not limited thereto. The contact portion 70 according to an embodiment of the present disclosure can include a metal layer 71, a first tacky layer 72 (e.g., an adhesive layer) which is coupled (or connected) to a first surface of the metal layer 71 and electrically contacts or is connected to the first electrode layer 13 of the vibration portion 10, and a second tacky layer 73 (e.g., an adhesive layer) which is coupled to a second surface of the metal layer 71 and is coupled to or attached on the first cover member 30. For example, contact portion 70 can have a tab shaped structure that is sandwiched between the vibration portion 10 and an upper surface of the first cover member 30.

The metal layer 71 can include a copper (Cu) material, but embodiments of the present disclosure are not limited thereto. The first tacky layer 72 can include or contain a conductive material to be electrically connected to or contact the first electrode layer 13 of the vibration portion 10. The second tacky layer 73 can include only an adhesive material, or can include or contain a conductive material.

In the vibration portion 10, a portion of one periphery portion of the first electrode layer 13 can be disposed at the one periphery portion EP of the first cover member 30 and can be supported by the contact portion 70. The other portion, except a portion, of the one periphery portion of the first electrode layer 13 can be supported by the first adhesive layer 41, or can be coupled to or attached on an inner surface of the first cover member 30 by a first adhesive layer 41.

The signal cable 90 can be electrically connected to each of the first and second electrode layers 13 and 15 of the vibration portion 10 at one side of the vibration portion 10. An end portion (or a distal end portion) of the signal cable 90 can be disposed at or inserted into a region (or a portion) between the one periphery portion EP of the first cover member 30 and the one periphery portion EP of the second cover member 50. For example, the signal cable 90 can be sandwiched between an upper surface of the second electrode layer 15 and the second cover member 50, and a portion of the second adhesive layer 42 can be between the second cover member 50 and the signal cable 90. The one periphery portion EP of the first cover member 30 and the one periphery portion EP of the second cover member 50 can accommodate a portion of the signal cable 90, or can vertically cover a portion of the signal cable 90. Accordingly, the signal cable 90 can be integrated with the vibration portion 10 or can be configured as one body with the vibration portion 10. For example, the vibration apparatus 1 according to the first embodiment of the present disclosure can be a vibration apparatus which is integrated with the signal cable 90 or configured as one body with the signal cable 90. For example, the signal cable 90 can be a flexible cable, a flexible printed circuit cable, a flexible flat cable, a single-sided flexible printed circuit, a single-sided flexible printed circuit board, a flexible multilayer printed circuit, or a flexible multilayer printed circuit board, but embodiments of the present disclosure are not limited thereto. For example, the vibration portion 10 can be sandwiched between the signal cable 90 and the contact portion 70 to form a structure that is between the first cover member 30 and second cover member 50.

The signal cable 90 according to an embodiment of the present disclosure can include a base member 91, a first signal line 92a, and a second signal line 92b.

The base member 91 can include a transparent or opaque plastic material. For example, the base member 91 can be implemented with one or more of synthetic resins including a fluorine resin, a polyimide-based resin, a polyurethane-based resin, a polyester-based resin, a polyethylene-based resin, and a polypropylene-based resin, but embodiments are not limited thereto. The base member 91 can be a base film or a base insulation film, but embodiments are not limited thereto.

The base member 91 can have a certain width in a first direction X and can extend long along a second direction Y intersecting with the first direction X.

The first signal line 92a can be disposed at a first surface of the base member 91 in parallel with the second direction Y. The second signal line 92b can be disposed at the first surface of the base member 91 in parallel with the second direction Y and can be spaced apart from the first signal line 92a. The first signal line 92a and the second signal line 92b can be arranged in parallel at the first surface of the base member 91. For example, the first signal line 92a and the second signal line 92b can be implemented in a line shape through patterning of a metal layer (or a conductive layer) formed or deposited at the first surface of the base member 91.

The first signal line 92a and the second signal line 92b can have different lengths. For example, the second signal line 92b can extend further than an end of the first signal line 92a (e.g., the end of the second signal line 92b extends past the end of the first signal line 92a, see FIGS. 1 and 4). Accordingly, a first portion of the base member 91 overlapping with the second signal line 92b can more further than an end of the first signal line 92a, and thus, the base member 91 or the signal cable 90 can include an extension portion 90a corresponding to an end portion of the second signal line 92b.

An end portion (or a distal end portion) of the first signal line 92a can be electrically connected to the contact portion 70. For example, the end portion (or the distal end portion) of the first signal line 92a can be directly connected to the contact portion 70. For example, the end portion (or the distal end portion) of the first signal line 92a can be directly connected to the contact portion 70 at the one periphery portion EP of the first cover member 30. For example, a second part of the contact portion 70 is connected to the first signal line 92a. The first signal line 92a can be attached on or contacted with the first tacky layer 72 (e.g., an adhesive layer) of the contact portion 70, and thus, can be electrically connected to or contacted with the first electrode layer 13 of the vibration portion 10 through the first tacky layer 72 and/or the metal layer 71 of the contact portion 70. Accordingly, the first signal line 92a can supply the first electrode layer 13 of the vibration portion 10 with a driving signal supplied from a vibration driving circuit. For example, the first signal line 92a can stop short to connect to the contact portion 70 below the vibration portion 10, while the second signal line 92b extends further to connect to an upper surface of the vibration portion 10.

An end portion (or a distal end portion) of the second signal line 92b can be electrically connected to or contacted with the second electrode layer 15 of the vibration portion 10. For example, the extension portion 90a of the signal cable 90 can pass through the one periphery portion EP of the second cover member 50 and can be disposed between the second cover member 50 and the vibration portion 10, and the second signal line 92b disposed at the extension portion 90a can be directly connected to or contacted with the second electrode layer 15 of the vibration portion 10. Accordingly, the second signal line 92b can supply the second electrode layer 15 of the vibration portion 10 with the driving signal supplied from the vibration driving circuit. In other words, the signal cable 90 has a "split type" of arrangement in which one side corresponding to the first signal line 92a connects under the vibration portion 10, while the other side corresponding to the second signal line 92b connects on top of the vibration portion 10 (e.g., the signal cable 90 together with contact portion 70 form a "forked tongue" type of connection structure for connecting the electrodes of the vibration portion 10 to the signal lines).

The signal cable 90 according to an embodiment of the present disclosure can further include an insulation layer 93 (e.g., see FIG. 4).

The insulation layer 93 can be disposed at the first surface of the base member 91 to cover each of the first signal line 92a and the second signal line 92b other than the end portion (or the distal end portion) of the signal cable 90. The insulation layer 93 can be a protective layer, a cover layer, a cover layer film, a cover film, or a cover insulation film, but embodiments are not limited thereto. For example, the first signal line 92a and the second signal line 92b are disposed between the base member 91 and the insulation layer 93, in which a portion of the insulation layer 93 can be pared back exposing ends of the first signal line 92a and the second signal line 92b.

The end portion (or the distal end portion) of the signal cable 90 inserted between the first cover member 30 and the second cover member 50 can be inserted or fixed between the first cover member 30 and the second cover member 50 by a film laminating process which uses a first adhesive layer 41 formed in the first cover member 30 and a second adhesive layer 42 formed in the second cover member 50. Therefore, the first signal line 92a can be stably maintained while being electrically connected to the contact portion 70, and the second signal line 92b can be stably maintained while being electrically connected to the second electrode layer 15 of the vibration portion 10. In addition, the end portion (or the distal end portion) of the signal cable 90 can be inserted or fixed between the first cover member 30 and the second cover member 50, and thus, a contact defect between the vibration portion 10 and the signal cable 90 caused by the movement of the signal cable 90 can be prevented (e.g., ends of the first signal line 92a and the second signal line 92b can be firmly held in place, even as the vibration portion 10 vibrates).

The contact portion 70 can be implemented to prevent or minimize a crack or damage of the vibration portion which occurs due to a step height between the first signal line 92a and the second signal line 92b in a film laminating process. For example, without the contact portion 70, the first signal line 92a and the second signal line 92b can be staggeredly arranged with the vibration portion 10 therebetween, and then, in performing a film laminating process, the first signal line 92a can function as a prop for the vibration layer 11 and a crack can occur in the vibration layer 11 between the first signal line 92a and the second signal line 92b based on pressing of the second cover member 50, causing a reduction in reliability of a vibration apparatus. For example, the contact portion 70 can help reduce any twisting or cracking of the vibration portion 10 and the base member 91. According to an embodiment of the present disclosure, the first electrode layer 13 of the vibration portion 10 can contact a portion of the contact portion 70 which is relatively thinner than the first signal line 92a, and thus, a step height between the second signal line 92b and the contact portion 70 can decrease, thereby preventing or minimizing the crack or damage of the vibration portion 10 occurring in a film laminating process.

In the vibration apparatus 1 according to the first embodiment of the present disclosure, the first signal line 92a of the signal cable 90 can be connected to the first electrode layer 13 of the vibration portion 10 through the contact portion 70 and the second signal line 92b of the signal cable 90 can be connected to the second electrode layer 15 of the vibration portion 10, and thus, a soldering process for an electrical connection between the vibration portion 10 and the signal cable 90 can not be needed, thereby simplifying a manufacturing process and a structure of the vibration apparatus 1. In addition, in the vibration apparatus 1 according to the first embodiment of the present disclosure, the driving signal can be supplied to the first electrode layer 13 and the second electrode layer 15 of the vibration portion 10 through the signal cable 90, and thus, an electrical characteristic, such as a resistivity, or the like, of the first and second electrode layers 13 and 15 can be complemented.

Figure 5:
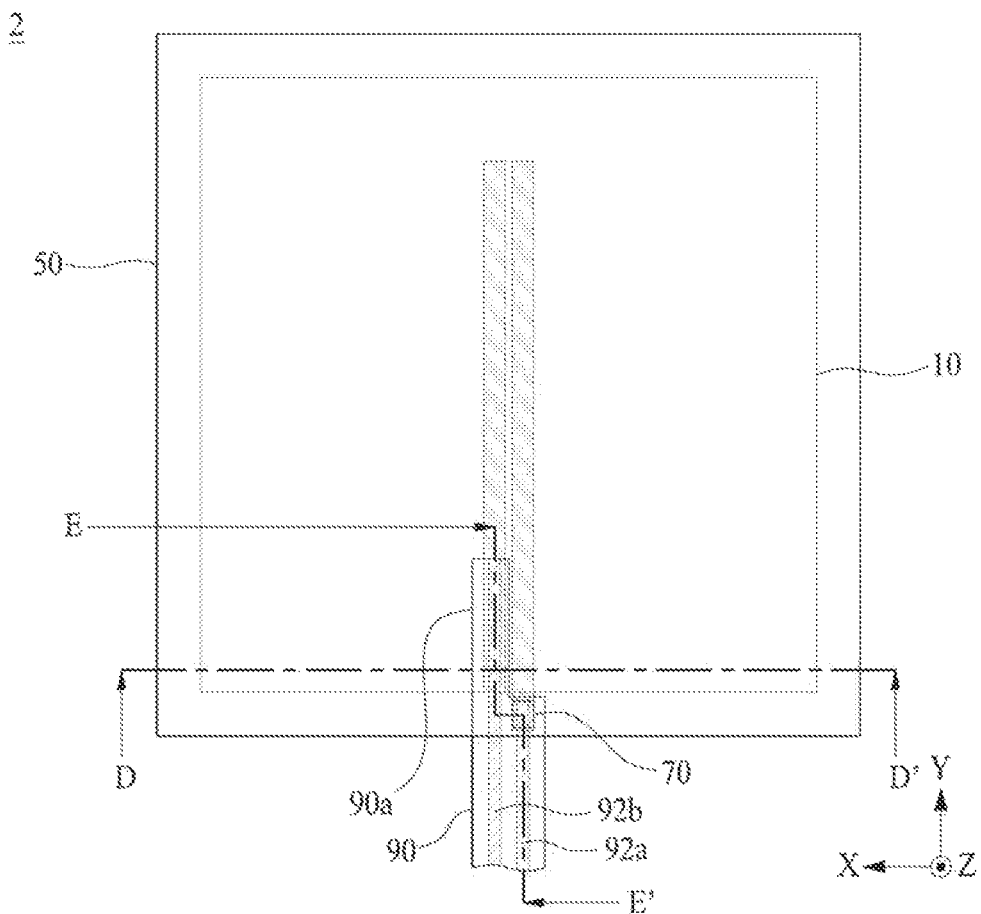
FIG. 5 illustrates a vibration apparatus according to another embodiment of the present disclosure.
Figure 6:
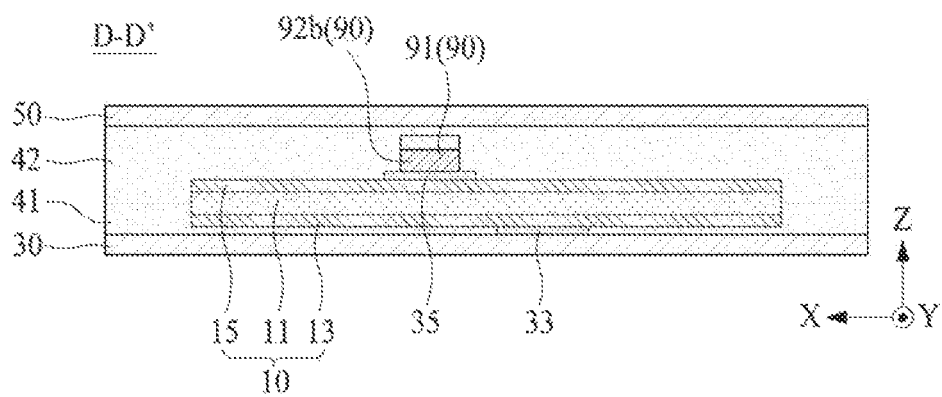
FIG. 6 is a cross-sectional view taken along line D-D' illustrated in FIG. 5 according to an embodiment of the present disclosure.
Figure 7:
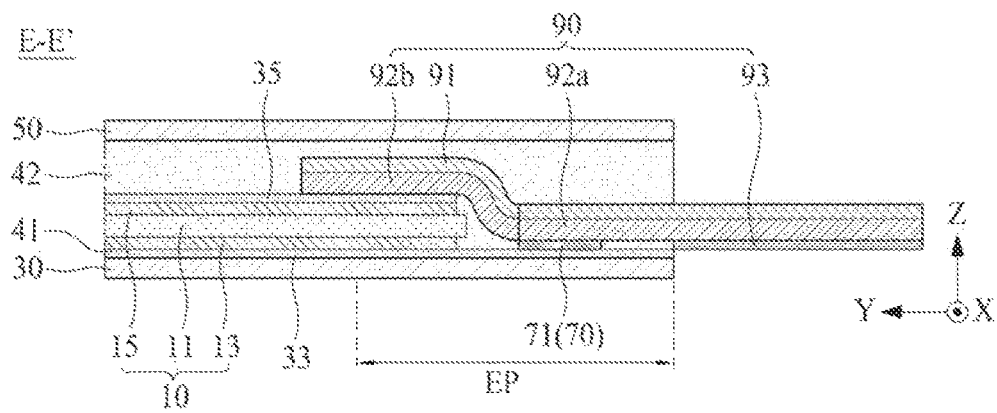
FIG. 7 is a cross-sectional view taken along line E-E' illustrated in FIG. 5 according to an embodiment of the present disclosure.

FIG. 5 illustrates a vibration apparatus according to a second embodiment of the present disclosure. FIG. 6 is a cross-sectional view taken along line D-D' illustrated in FIG. 5. FIG. 7 is a cross-sectional view taken along line E-E' illustrated in FIG. 5. FIGS. 5 to 7 illustrate an embodiment where a metal line is additionally configured in the vibration apparatus described above with reference to FIGS. 1 to 4. In descriptions of FIGS. 5 to 7, therefore, the other elements except a for metal line(s) and relevant elements are referred to by like reference numerals and repetitive descriptions thereof can be omitted.

With reference to FIGS. 5 to 7, a vibration apparatus 2 according to a second embodiment of the present disclosure can include first and second metal lines 33 and 35.

The first metal line 33 can be disposed at a first cover member 30 and can be electrically connected to or contacted with a first electrode layer 13 of a vibration portion 10. For example, the first metal line 33 can extend long along a second direction Y from the one periphery portion EP of the first cover member 30 to overlap the vibration portion 10. For example, with respect to the second direction Y, the first metal line 33 can have the same length as the vibration portion 10, or can have a length which is greater than or equal to half of a length of the vibration portion 10. For example, the first metal line 33 can be disposed close to a center portion of the vibration portion 10.

The first metal line 33 can be implemented with a conductive material having a low resistivity, to prevent or minimize a reduction in electrical characteristic and vibration characteristic of the vibration portion 10 caused by a resistivity of the first electrode layer 13. For example, the first metal line 33 can be applied when the first electrode layer 13 has a high resistivity. For example, the first metal line 33 can include a metal material such as Cu, or the like, but embodiments of the present disclosure are not limited thereto. For example, the first metal line 33 can be formed to have a relatively large width, to prevent or minimize a reduction in electrical characteristic (e.g., prevents a voltage drop) and vibration characteristic of the vibration portion 10 when the first electrode layer 13 has a high resistivity. For example, with respect to the first direction X (or a widthwise direction), a width of the first metal line 33 can be greater than or equal to 1/20 of a width (or a horizontal width) of the vibration portion 10. For example, when the width (or the horizontal width) of the vibration portion 10 is 6 cm, the width of the first metal line 33 can be 0.3 cm or more.

The first metal line 33 can be electrically connected to or contacted with a first signal line 92a of a signal cable 90 through a contact portion 70 at the one periphery portion EP of the first cover member 30. Therefore, the first signal line 92a can be electrically connected to or contacted with the first electrode layer 13 of the vibration portion 10 through the contact portion 70 and the first metal line 33, thereby transferring or supplying the driving signal supplied from the vibration driving circuit to the first electrode layer 13 of the vibration portion 10.

In the vibration apparatus 2 according to the second embodiment of the present disclosure, the contact portion 70 can be disposed or interposed between the first metal line 33 and the first signal line 92a. The contact portion 70 can be implemented to electrically connect to or contact with the first metal line 33 and the first signal line 92a and can be spaced apart from the vibration portion 10 without electrically contacting the vibration portion 10 in the one periphery portion EP of the first cover member 30.

The second metal line 35 can be disposed between a second electrode layer 15 of the vibration portion 10 and a second cover member 50 and can be electrically connected to or contacted with the second electrode layer 15 of the vibration portion 10. For example, the second metal line 35 can be formed to directly contact the second electrode layer 15 of the vibration portion 10 without a medium. For example, the second metal line 35 can extend a long ways along the second direction Y from the one periphery portion EP of the second cover member 50 to overlap the vibration portion 10. For example, with respect to the second direction Y, the second metal line 35 can have the same length as the vibration portion 10, or can have a length which is greater than or equal to half of a length of the vibration portion 10. For example, the second metal line 35 can be disposed close to a center portion of the vibration portion 10.

The second metal line 35 can be implemented with a conductive material having a low resistivity, to prevent or minimize a reduction in electrical characteristic (e.g., to prevent a voltage drop) and vibration characteristic of the vibration portion 10 caused by a resistivity of the second electrode layer 15. For example, the second metal line 35 can be applied when the second electrode layer 15 has a high resistivity. For example, the second metal line 35 can include a metal material such as Cu, or the like, but embodiments of the present disclosure are not limited thereto. For example, the second metal line 35 can be formed to have a relatively large width, to prevent or minimize a reduction in electrical characteristic and vibration characteristic of the vibration portion 10 when the second electrode layer 15 has a high resistivity. For example, with respect to the first direction X (or the widthwise direction), a width of the second metal line 35 can be greater than or equal to 1/20 of a width (or a horizontal width) of the vibration portion 10. For example, when the width (or the horizontal width) of the vibration portion 10 is 6 cm, the width of the second metal line 35 can be 0.3 cm or more, and can be the same as or different from the width of the first metal line 33.

The second metal line 35 can be electrically connected to or contacted with an end portion (or a distal end portion) of the second signal line 92b. The end portion (or the distal end portion) of the second signal line 92b can be directly connected to or contacted with the second metal line 35, over the vibration portion 10. Therefore, the second signal line 92b can be electrically connected to or contacted with the second electrode layer 15 of the vibration portion 10 through the second metal line 35, thereby transferring or supplying the driving signal supplied from the vibration driving circuit to the second electrode layer 15 of the vibration portion 10. For example, the configuration in the second embodiment is similar to the first embodiment, but first and second metal lines 33 and 35 are added, which can extend the "forked tongue" type of connection structure for connecting the electrodes of the vibration portion 10 to the signal lines, in which the first metal line 33 connects to the underside of the vibration portion 10 and the second metal line 35 connects to the top of the vibration portion 10. Also, the first and second metal lines 33 and 35 are disposed near the center of the vibration portion and are than half as long as or equal to the length of the vibration portion 10. In this way, voltages can be uniformly distributed across the vibration portion 10, and the vibration portion 10 can be more effectively controlled when providing vibrations.

In the vibration apparatus 2 according to the second embodiment of the present disclosure, a soldering process for an electrical connection between the vibration portion 10 and the signal cable 90 can not be needed, thereby simplifying a manufacturing process and a structure of the vibration apparatus 2. In addition, in the vibration apparatus 2 according to the second embodiment of the present disclosure, the driving signal can be supplied to the first electrode layer 13 and the second electrode layer 15 of the vibration portion 10 through the metal lines 33 and 35 having a low resistivity, and thus, an electrical characteristic, such as a resistivity, or the like, of the first and second electrode layers 13 and 15 can be complemented (e.g., a voltage drop can be prevented or minimized, and voltages can be uniformly distributed even when the vibration member 10 has a large area).

Figure 8:
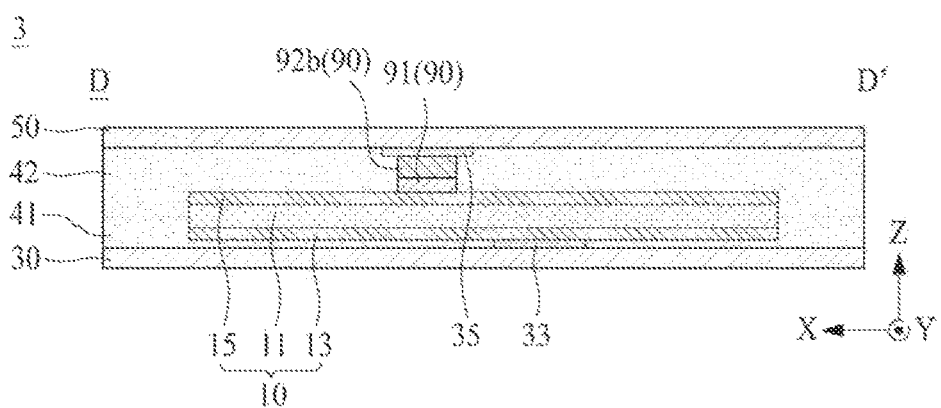
FIG. 8 is another cross-sectional view taken along line D-D' illustrated in FIG. 5 according to an embodiment of the present disclosure.
Figure 9:
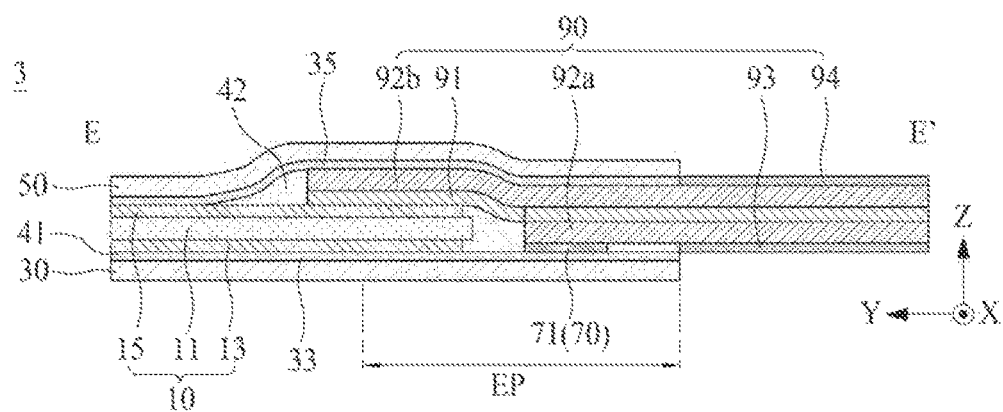
FIG. 9 is another cross-sectional view taken along line E-E' illustrated in FIG. 5 according to an embodiment of the present disclosure.

FIG. 8 is another cross-sectional view taken along line D-D' illustrated in FIG. 5. FIG. 9 is another cross-sectional view taken along line E-E' illustrated in FIG. 5. FIGS. 8 and 9 illustrate an embodiment implemented by modifying the second metal line 35 in the vibration apparatus described above with reference to FIGS. 5 to 7. In descriptions of FIGS. 8 and 9, therefore, the other elements except a second metal line and relevant elements are referred to by like reference numerals and repetitive descriptions thereof can be omitted.

With reference to FIGS. 8 and 9, in a vibration apparatus 3 according to a third embodiment of the present disclosure, a second metal line 35 can be disposed at a second cover member 50 and can be electrically connected to or contacted with a second electrode layer 15 of a vibration portion 10. For example, the second metal line 35 can extend long along a second direction Y from the one periphery portion EP of the second cover member 50 to overlap the vibration portion 10. For example, with respect to the second direction Y, the second metal line 35 can have the same length as the vibration portion 10, or can have a length which is greater than or equal to half of a length of the vibration portion 10.

The second metal line 35 can be implemented with a conductive material having a low resistivity, to prevent or minimize a reduction in electrical characteristic and vibration characteristic of the vibration portion 10 caused by a resistivity of the second electrode layer 15. For example, the second metal line 35 can be applied when the second electrode layer 15 has a high resistivity. For example, the second metal line 35 can include a metal material such as Cu, or the like, but embodiments of the present disclosure are not limited thereto.

A second signal line 92b of a signal cable 90 can be disposed at a second surface, which is opposite to a first surface, of a base member 91. For example, the signal cable 90 can include a double-sided line structure. The second signal line 92b can be covered by a second insulation layer 94. For example, the base member 91 can be disposed between the second electrode layer 15 and the second signal line 92b, and the second signal line 92b can be disposed between the base member 91 and the second metal line 35. In this way, multiple layers can be interwoven together forming a strong physical connection between the signal cable 90 and the vibration portion 10.

An end portion (or a distal end portion) of the second signal line 92b can be disposed or inserted between the one periphery portion EP of the second cover member 50 and the vibration portion 10 and can be electrically connected to or contacted with the second metal line 35.

The one periphery portion of the second metal line 35 disposed at the one periphery portion EP of the second cover member 50 can be electrically connected to or contacted with the second signal line 92b of the signal cable 90. The other portion, except the one periphery portion, of the second metal line 35 can be electrically connected to or contacted with the second electrode layer 15 of the vibration portion 10 by a film laminating process using a second adhesive layer 42. For example, the other portion, except the one periphery portion, of the second metal line 35 can be electrically connected to or contacted with the second electrode layer 15 of the vibration portion 10 through pressing of the second cover member 50 based on a film laminating process. The second cover member 50 can have flexibility, and thus, can be bent in a curved shape at a stepped portion between the end portion of the second signal line 92b and the second electrode layer 15 of the vibration portion 10, whereby the second metal line 35 can be bent toward the second electrode layer 15 of the vibration portion 10 as the second cover member 50 is bent. For example, the various layers can be interleaved.

In the vibration apparatus 3 according to the third embodiment of the present disclosure, a soldering process for an electrical connection between the vibration portion 10 and the signal cable 90 can not be needed, thereby simplifying a manufacturing process and a structure of the vibration apparatus 2. In addition, in the vibration apparatus 3 according to the third embodiment of the present disclosure, the driving signal can be supplied to the first electrode layer 13 and the second electrode layer 15 of the vibration portion 10 through the metal lines 33 and 35 having a low resistivity, and thus, an electrical characteristic, such as a resistivity, or the like, of the first and second electrode layers 13 and 15 can be complemented. In addition, in the vibration apparatus 3 according to the third embodiment of the present disclosure, comparing with the vibration apparatus 2 according to the second embodiment of the present disclosure, all of the first and second metal lines 33 and 35 can be disposed in corresponding cover members 30 and 50, and thus, a manufacturing process can be more simplified.

Figure 10:
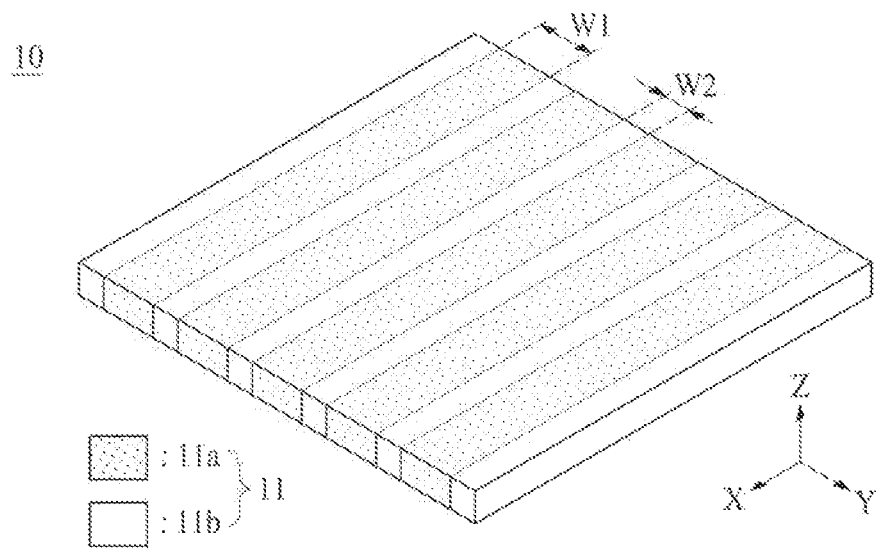
FIG. 10 is a perspective view illustrating a vibration layer of a vibration portion according to another embodiment of the present disclosure.

FIG. 10 is a perspective view illustrating a vibration layer 11 of a vibration portion 10 according to another embodiment of the present disclosure. FIG. 10 illustrates a vibration layer illustrated in FIGS. 2 to 4, and 6 to 9.

With reference to FIG. 10, the vibration layer 11 according to another embodiment of the present disclosure can include a plurality of first portions 11a and a plurality of second portions 11b. For example, the plurality of first portions 11a and the plurality of second portions 11b can be alternately and repeatedly arranged along a first direction X (or a second direction Y) (e.g., in alternating stripe patterns). For example, the first direction X can be a widthwise direction of the vibration layer 11, the second direction Y can be a lengthwise direction of the vibration layer 11, but embodiments of the present disclosure are not limited thereto, the first direction X can be the lengthwise direction of the vibration layer 11, and the second direction Y can be the widthwise direction of the vibration layer 11.

Each of the plurality of first portions 11a can be configured as an inorganic material portion. The inorganic material portion can include a piezoelectric material, a composite piezoelectric material, or an electroactive material which includes a piezoelectric effect.

Each of the plurality of first portions 11a can be configured as a ceramic-based material for generating a relatively high vibration, or can be configured as a piezoelectric ceramic having a perovskite-based crystalline structure. The perovskite crystalline structure can have a piezoelectric effect and an inverse piezoelectric effect, and can be a structure having orientation. The perovskite crystalline structure can be represented by a chemical formula "$ABO_3$". In the chemical formula, "A" can include a divalent metal element, and "B" can include a tetravalent metal element. As an embodiment of the present disclosure, in the chemical formula "$ABO_3$," "A," and "B" can be cations, and "O" can be anions. For example, each of the plurality of first portions 11a can include at least one or more of lead (II) titanate ($PbTiO_3$), lead zirconate ($PbZrO_3$), lead zirconate titanate ($PbZrTiO_3$), barium titanate ($BaTiO_3$), and strontium titanate ($SrTiO_3$), but embodiments of the present disclosure are not limited thereto.

Each of the plurality of first portions 11a according to an embodiment of the present disclosure can be disposed between the plurality of second portions 11b and can have a first width W1 parallel to the first direction X (or the second direction Y) and a length parallel to the second direction Y (or the first direction X). Each of the plurality of second portions 11b can have a second width W2 parallel to the first direction X (or the second direction Y) and can have a length parallel to the second direction Y (or the first direction X). The first width W1 can be the same as or different from the second width W2. For example, the first width W1 can be greater than the second width W2. For example, the first portion 11a and the second portion 11b can include a line shape or a stripe shape which has the same size or different sizes. Therefore, the vibration layer 11 can include a 2-2 composite structure having a piezoelectric characteristic of a 2-2 vibration mode, and thus, can have a resonance frequency of 20 kHz or less, but embodiments of the present disclosure are not limited thereto. For example, a resonance frequency of the vibration layer 11 can vary based on at least one or more of a shape, a length, and a thickness, or the like.

In the vibration layer 11, each of the plurality of first portions 11a and the plurality of second portions 11b can be disposed (or arranged) at the same plane (or the same layer) in parallel. Each of the plurality of second portions 11b can be configured to fill a gap between two adjacent first portions of the plurality of first portions 11a and can be connected to or attached on a first portion 11a adjacent thereto. Therefore, the vibration layer 11 can extend by a desired size or length based on the side coupling (or connection) of the first portion 11a and the second portion 11b.

In the vibration layer 11, a width (or a size) W2 of each of the plurality of second portions 11b can progressively decrease in a direction from a center portion to both peripheries (or both ends or both portions) of the vibration layer 11 or the vibration apparatus 1, 2, and 3.

According to an embodiment of the present disclosure, a second portion 11b, having a largest width W2 among the plurality of second portions 11b, can be located at a portion at which a highest stress can concentrate when the vibration layer 11 or the vibration apparatus 1, 2, and 3 is vibrating in a vertical direction Z (or a thickness direction). A second portion 11b, having a smallest width W2 among the plurality of second portions 11b, can be located at a portion where a relatively low stress can occur when the vibration layer 11 or the vibration apparatus 1, 2, and 3 is vibrating in the vertical direction Z. For example, the second portion 11b, having the largest width W2 among the plurality of second portions 11b, can be disposed at the center portion of the vibration layer 11, and the second portion 11b, having the smallest width W2 among the plurality of second portions 11b can be disposed at each of the both peripheries of the vibration layer 11. Therefore, when the vibration layer 11 or the vibration apparatus 1, 2, and 3 is vibrating in the vertical direction Z, interference of a sound wave or overlapping of a resonance frequency, each occurring in the portion on which the highest stress concentrates, can be reduced or minimized. Thus, a dip phenomenon of a sound pressure level occurring in the low-pitched sound band can be reduced, thereby improving flatness of a sound characteristic in the low-pitched sound band. For example, flatness of a sound characteristic can be a level of a deviation between a highest sound pressure level and a lowest sound pressure level.

In the vibration layer 11, each of the plurality of first portions 11a can have different sizes (or widths). For example, a size (or a width) of each of the plurality of first portions 11a can progressively decrease or increase in a direction from the center portion to the both peripheries (or both ends or both portions) of the vibration layer 11 or the vibration apparatus 1, 2, and 3. For example, in the vibration layer 11, a sound pressure level characteristic of a sound can be enhanced and a sound reproduction band can increase, based on various natural vibration frequencies according to a vibration of each of the plurality of first portions 11a having different sizes.

The plurality of second portions 11b can be disposed between the plurality of first portions 11a. Therefore, in the vibration layer 11 or the vibration apparatus 1, 2, and 3, vibration energy by a link in a unit lattice of each first portion 11a can increase by a corresponding second portion 11b, and thus, a vibration characteristic can increase, and a piezoelectric characteristic and flexibility can be secured. For example, the second portion 11b can include one or more of an epoxy-based polymer, an acrylic-based polymer, and a silicone-based polymer, but embodiments of the present disclosure are not limited thereto.

The plurality of second portions 11b according to an embodiment of the present disclosure can be configured as an organic material portion. For example, the organic material portion can be disposed between the inorganic material portions, and thus, can absorb an impact applied to the inorganic material portion (or the first portion), can release a stress concentrating on the inorganic material portion to enhance the total durability of the vibration layer 11 or the vibration apparatus 1, 2, and 3, and can provide flexibility to the vibration layer 11 or the vibration apparatus 1, 2, and 3. Thus, the vibration apparatus 1, 2, and 3 can have flexibility, and thus, can be bent in a shape which matches a shape of a curved portion configured in a vibration member or a vibration object. For example, the vibration apparatus 1, 2, and 3 can have flexibility, and thus, can be disposed along a shape corresponding to a shape of the curved portion of the vibration member or the vibration object.

The plurality of second portions 11b according to an embodiment of the present disclosure can have modulus (or Young's modulus) and viscoelasticity that are lower than those of each first portion 11a, and thus, the second portion 11b can enhance the reliability of each first portion 11a vulnerable to an impact due to a fragile characteristic. For example, the second portion 11b can be configured as a material having a loss coefficient of about 0.01 to about 1 (e.g., 0.5) and modulus of about 0.1 GPa (Giga Pascal) to about 10 GPa (Giga Pascal) (e.g., 5 GPa).

The organic material portion configured at the second portion 11b can include one or more of an organic material, an organic polymer, an organic piezoelectric material, or an organic non-piezoelectric material that has a flexible characteristic in comparison with the inorganic material portion of the first portions 11a. For example, the second portion 11b can be referred to as an adhesive portion, an elastic portion, a bending portion, a damping portion, or a flexible portion, or the like each having flexibility, but embodiments of the present disclosure are not limited thereto.

The plurality of first portions 11a and the second portion 11b can be disposed on (or connected to) the same plane, and thus, the vibration layer 11 according to an embodiment of the present disclosure can have a single thin film-type. For example, the vibration layer 11 can have a structure in which a plurality of first portions 11a are connected to one side. For example, the plurality of first portions 11a can have a structure connected to a whole of the vibration layer 11. For example, the vibration layer 11 can be vibrated in a vertical direction by the first portion 11a having a vibration characteristic and can be bent in a curved shape by the second portion 11b having flexibility. In addition, in the vibration layer 11 according to an embodiment of the present disclosure, a size of the first portion 11a and a size of the second portion 11b can be adjusted based on a piezoelectric characteristic and flexibility needed for the vibration layer 11 or the vibration apparatus 1, 2, and 3. As an embodiment of the present disclosure, when the vibration layer 11 needs a piezoelectric characteristic rather than flexibility, a size of the first portion 11a can be adjusted to be greater than that of the second portion 11b. As another embodiment of the present disclosure, when the vibration layer 11 needs flexibility rather than a piezoelectric characteristic, a size of the second portion 11b can be adjusted to be greater than that of the first portion 11a. Accordingly, a size of the vibration layer 11 can be adjusted based on a characteristic needed therefor, and thus, the vibration layer 11 can be adjusted to meet various needs.

The first electrode layer 13 can be disposed at a first surface (or a lower surface) of the vibration layer 11. The first electrode layer 13 can be disposed at or coupled to a first surface of each of the plurality of first portions 11a and a first surface of each of the plurality of second portions 11b in common and can be electrically connected to the first surface of each of the plurality of first portions 11a. For example, the first electrode layer 13 can be a single-body electrode (or one electrode) shape which is disposed at a whole first surface of the vibration layer 11. For example, the first electrode layer 13 can have substantially the same shape as the vibration layer 11, but embodiments of the present disclosure are not limited thereto.

The second electrode layer 15 can be disposed at a second surface (or an upper surface) different from (or opposite to) the first surface of the vibration layer 11. The second electrode layer 15 can be disposed at or coupled to a second surface of each of the plurality of first portions 11a and a second surface of each of the plurality of second portions 11b in common and can be electrically connected to the second surface of each of the plurality of first portions 11a. For example, the second electrode layer 15 can be a single-body electrode (or one electrode) shape which is disposed at a whole second surface of the vibration layer 11. The second electrode layer 15 can have the same shape as the vibration layer 11, but embodiments of the present disclosure are not limited thereto.

One or more of the first electrode layer 13 and the second electrode layer 15 according to an embodiment of the present disclosure can be formed of a transparent conductive material, a semitransparent conductive material, or an opaque conductive material. For example, the transparent conductive material or the semitransparent conductive material can include indium tin oxide (ITO) or indium zinc oxide (IZO), but embodiments of the present disclosure are not limited thereto. The opaque conductive material can include gold (Au), silver (Ag), platinum (Pt), palladium (Pd), molybdenum (Mo), magnesium (Mg), or glass frit-containing silver (Ag), but embodiments of the present disclosure are not limited thereto. According to another embodiment of the present disclosure, in order to enhance an electrical characteristic and/or a vibration characteristic of the vibration layer 11, each of the first electrode layer 13 and the second electrode layer 15 can include Ag having a low resistivity. For example, carbon can be carbon black, ketjen black, carbon nanotube, and a carbon material including graphite, but embodiments of the present disclosure are not limited thereto.

The vibration layer 11 can be polarized (or poling) by a certain voltage applied to the first electrode layer 13 and the second electrode layer 15 in a certain temperature atmosphere, or a temperature atmosphere that can be changed from a high temperature to a room temperature, but embodiments of the present disclosure are not limited thereto. For example, the vibration layer 11 can alternately and repeatedly contract or expand based on an inverse piezoelectric effect according to a sound signal (or a voice signal or a driving signal) applied to the first electrode layer 13 and the second electrode layer 15 from the outside to vibrate. For example, the vibration layer 11 can vibrate based on a vertical-direction vibration and a planar direction vibration by the sound signal applied to the first electrode layer 13 and the second electrode layer 15. The vibration layer 11 can increase the displacement of a vibration member by contraction and/or expansion of the planar direction, thereby further improving the vibration of the vibration member.

Figure 11:
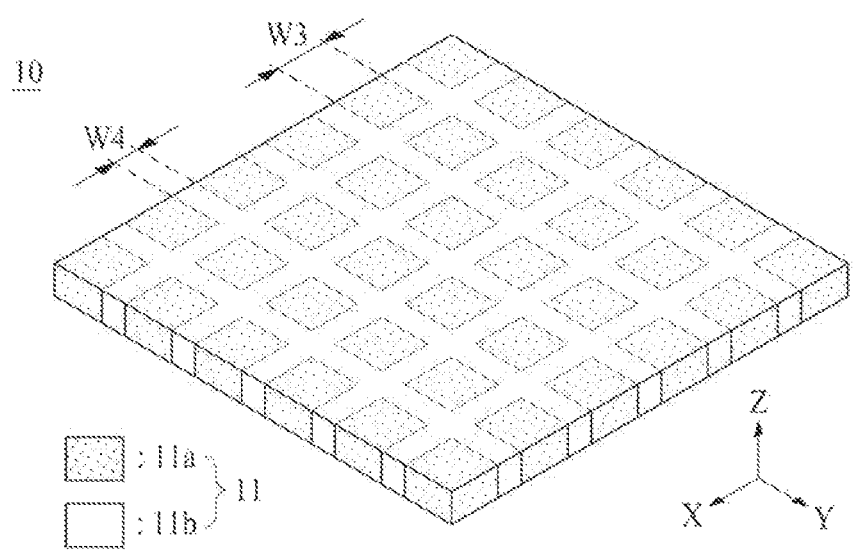
FIG. 11 is a perspective view illustrating another embodiment of a vibration portion illustrated in FIG. 10.

FIG. 11 is a perspective view illustrating another embodiment of a vibration layer illustrated in FIG. 10.

With reference to FIG. 11, the vibration layer 11 according to another embodiment of the present disclosure can include a plurality of first portions 11a, which are spaced apart from one another along a first direction X and a second direction Y, and a second portion 11b disposed between the plurality of first portions 11a.

Each of the plurality of first portions 11a can be disposed to be spaced apart from one another along the first direction X and the second direction Y. For example, each of the plurality of first portions 11a can have a hexahedral shape (or a six-sided object shape) having the same size and can be disposed in a lattice shape or a grid configuration. Each of the plurality of first portions 11a can include a piezoelectric material which is be substantially the same as the first portion 11a described above with reference to FIG. 10, and thus, like reference numeral refer to like element and the repetitive description thereof can be omitted.

The second portion 11b can be disposed between the plurality of first portions 11a along each of the first direction X and the second direction Y. The second portion 11b can be configured to fill a gap or a space between two adjacent first portions 11a or to surround each of the plurality of first portions 11a, and thus, can be connected to or attached on an adjacent first portion 11a. According to an embodiment of the present disclosure, a width W4 of a second portion 11b disposed between two first portions 11a adjacent to each other along the first direction X can be the same as or different from that of a width W3 of the first portion 11a, and the width W4 of the second portion 11b disposed between two first portions 11a adjacent to each other along the second direction Y can be the same as or different from the width W3 of the first portion 11a. The second portion 11b can include an organic material which is be substantially the same as the second portion 11b described above with reference to FIG. 10, and thus, like reference numeral refer to like element and the repetitive description thereof can be omitted.

The vibration layer 11 according to another embodiment of the present disclosure can include a 1-3 composite structure having a piezoelectric characteristic of a 1-3 vibration mode, and thus, can have a resonance frequency of 30 MHz or less, but embodiments of the present disclosure are not limited thereto. For example, a resonance frequency of the vibration layer 11 can vary based on at least one or more of a shape, a length, and a thickness, or the like.

Figure 12:
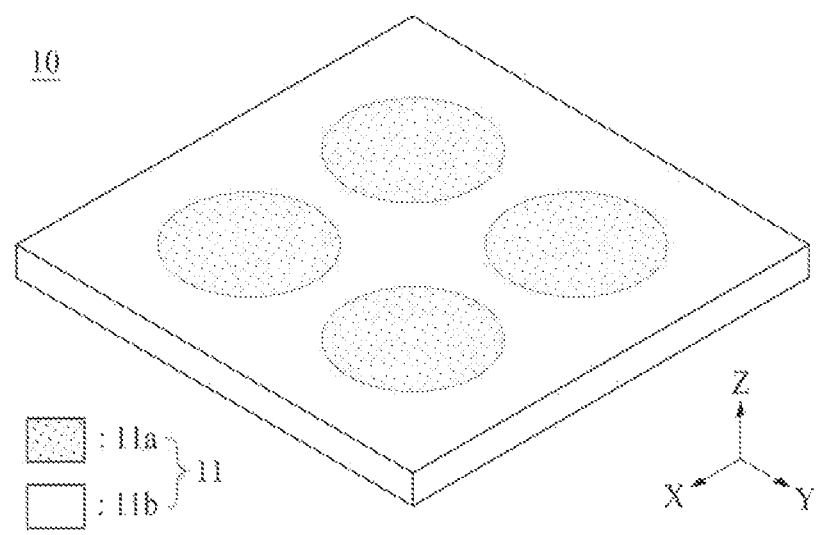
FIG. 12 is a perspective view illustrating another embodiment of a vibration portion illustrated in FIG. 10.

FIG. 12 is a perspective view illustrating another embodiment of a vibration portion illustrated in FIG. 10.

With reference to FIG. 12, the vibration layer 11 according to another embodiment of the present disclosure can include a plurality of first portions 11a, which are spaced apart from one another along a first direction X and a second direction Y, and a second portion 11b disposed between the plurality of first portions 11a.

Each of the plurality of first portions 11a can have a flat structure of a circular shape. For example, each of the plurality of first portions 11a can have a circular plate shape, but embodiments of the present disclosure are not limited thereto. For example, each of the plurality of first portions 11a can have a dot shape including an oval shape, a polygonal shape, or a donut shape. Each of the plurality of first portions 11a can include a piezoelectric material which is be substantially the same as the first portion 11a described above with reference to FIG. 10, and thus, like reference numerals referring to like elements and the repetitive description thereof can be omitted.

The second portion 11b can be disposed between the plurality of first portions 11a along each of the first direction X and the second direction Y. The second portion 11b can be configured to surround each of the plurality of first portions 11a, and thus, can be connected to or attached on a side surface of each of the plurality of first portions 11a. Each of the plurality of first portions 11a and the second portion 11b can be disposed (or arranged) in parallel on the same plane (or the same layer). The second portion 11b can include an organic material which is be substantially the same as the second portion 11b described above with reference to FIG. 10, and thus, like reference numeral refer to like element and the repetitive description thereof can be omitted.

Figure 13:
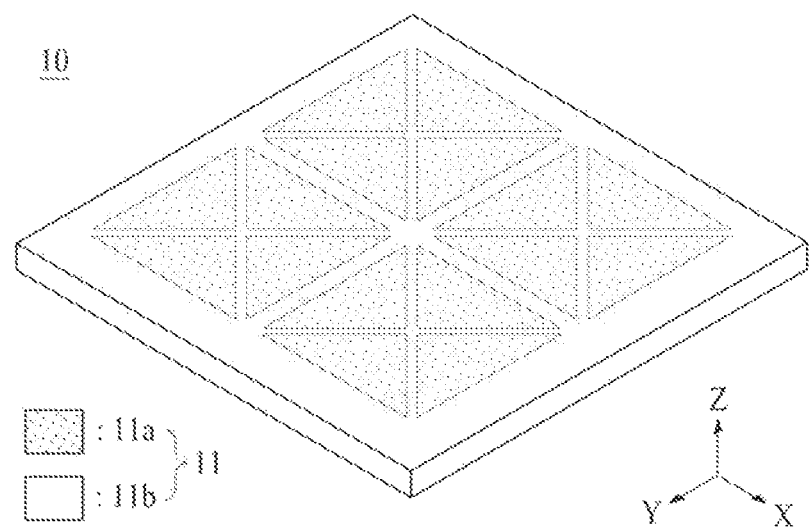
FIG. 13 is a perspective view illustrating another embodiment of a vibration portion illustrated in FIG. 10.

FIG. 13 is a perspective view illustrating another embodiment of a vibration portion illustrated in FIG. 10.

With reference to FIG. 13, the vibration layer 11 according to another embodiment of the present disclosure can include a plurality of first portions 11a, which are spaced apart from one another along a first direction X and a second direction Y, and a second portion 11b disposed between the plurality of first portions 11a.

Each of the plurality of first portions 11a can have a flat structure of a triangular shape. For example, each of the plurality of first portions 11a can have a triangular plate shape, but embodiments of the present disclosure are not limited thereto. Each of the plurality of first portions 11a can include a piezoelectric material which is be substantially the same as the first portion 11a described above with reference to FIG. 10, and thus, like reference numeral refer to like element and the repetitive description thereof can be omitted.

According to an embodiment of the present disclosure, four adjacent first portions 11a among the plurality of first portions 11a can be adjacent to one another to form a tetragonal (or a square shape or quadrilateral shape). Vertices of the four adjacent first portions 11a forming a tetragonal shape can be adjacent to one another in a center portion (or a central portion) of the tetragonal shape.

The second portion 11b can be disposed between the plurality of first portions 11a along each of the first direction X and the second direction Y. The second portion 11b can be configured to surround each of the plurality of first portions 11a, and thus, can be connected to or attached on a side surface of each of the plurality of first portions 11a. Each of the plurality of first portions 11a and the second portion 11b can be disposed (or arranged) in parallel on the same plane (or the same layer). The second portion 11b can include an organic material which is be substantially the same as the second portion 11b described above with reference to FIG. 10, and thus, like reference numeral refer to like element and the repetitive description thereof can be omitted.

According to another embodiment of the present disclosure, 2N (where N is a natural number greater than or equal to 2) adjacent first portions 11a of the plurality of first portions 11a having the triangular shape can be disposed adjacent to one another to form a 2N-angular shape. For example, six adjacent first portions 11a of the plurality of first portions 11a can be adjacent to one another to form a hexagonal shape (or a regularly hexagonal shape). Vertices of the six adjacent first portions 11a forming a hexagonal shape can be adjacent to one another in a center portion (or a central portion) of the hexagonal shape. The second portion 11b can be configured to surround each of the plurality of first portions 11a, and thus, can be connected to or attached on a side surface of each of the plurality of first portions 11a. Each of the plurality of first portions 11a and the second portion 11b can be disposed (or arranged) in parallel on the same plane (or the same layer).

Figure 14:
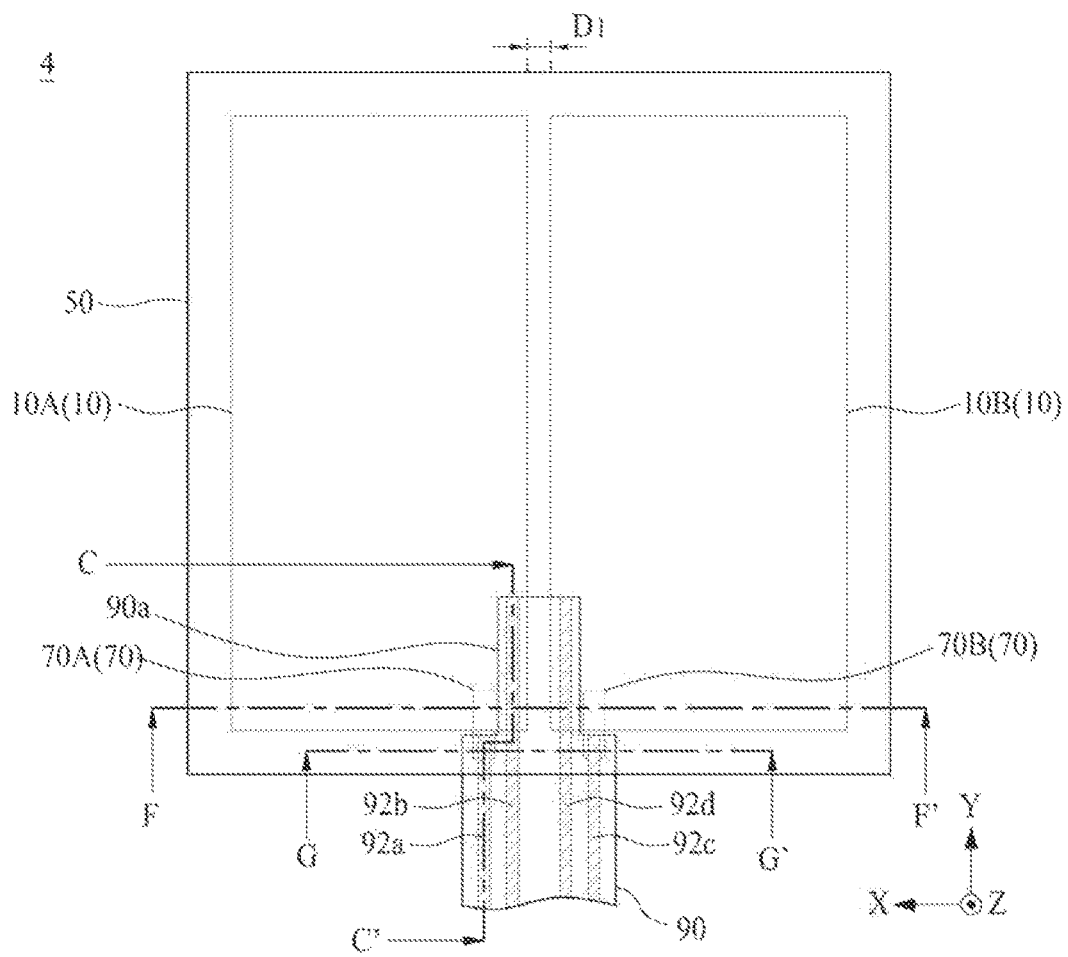
FIG. 14 illustrates a vibration apparatus according to an embodiment of the present disclosure.
Figure 15:
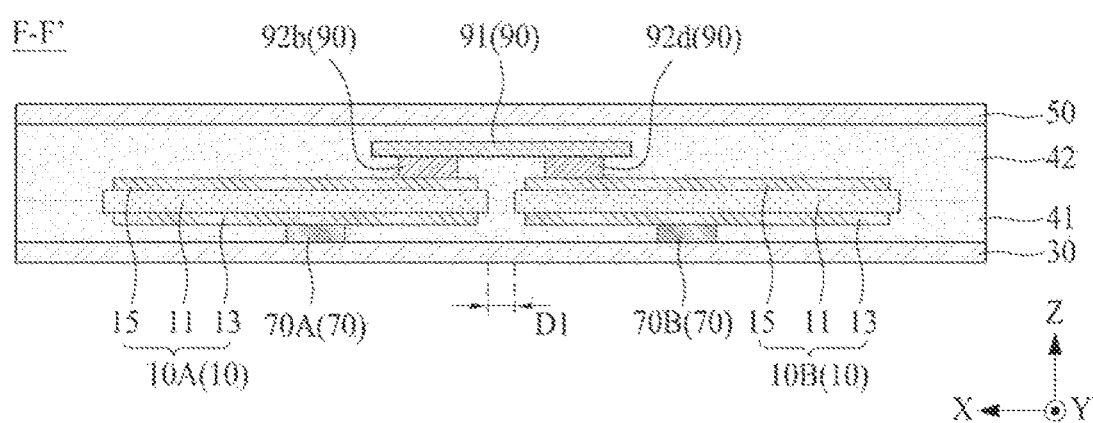
FIG. 15 is a cross-sectional view taken along line F-F' illustrated in FIG. 14 according to an embodiment of the present disclosure.
Figure 16:
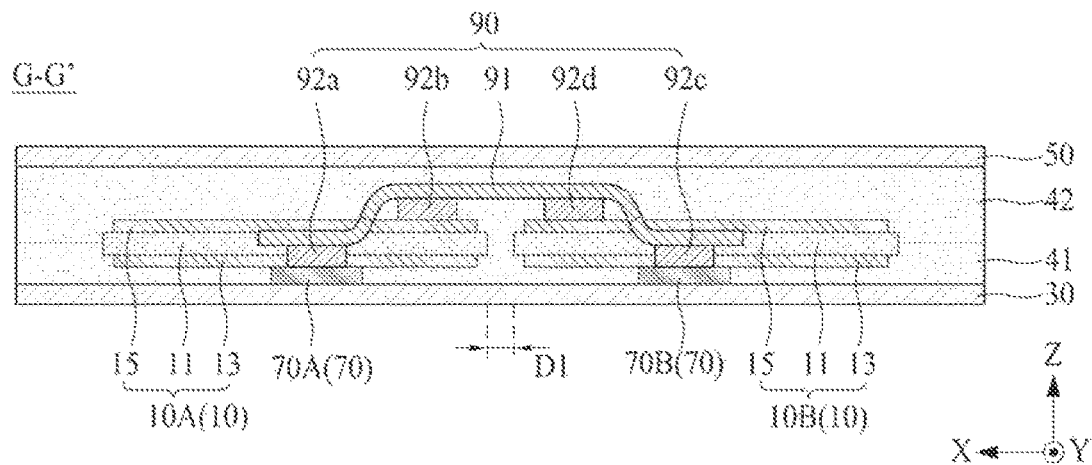
FIG. 16 is a cross-sectional view taken along line G-G' illustrated in FIG. 14 according to an embodiment of the present disclosure.

FIG. 14 illustrates a vibration apparatus according to a fourth embodiment of the present disclosure. FIG. 15 is a cross-sectional view taken along line F-F' illustrated in FIG. 14. FIG. 16 is a cross-sectional view taken along line G-G' illustrated in FIG. 14. A cross-sectional view taken along line C-C' illustrated in FIG. 14 is illustrated in FIG. 4.

With reference to FIGS. 4 and 14 to 16, the vibration apparatus 4 according to a fourth embodiment of the present disclosure can include a vibration portion 10, a first cover member 30, a second cover member 50, a contact portion 70, and a signal cable 90.

The vibration portion 10 can include a first vibration portion 10A and a second vibration portion 10B.

Each of the first and second vibration portions 10A and 10B can be electrically separated and disposed while being spaced apart from each other along a first direction X. Each of the first and second vibration portions 10A and 10B can alternately and repeatedly contract and/or expand based on a piezoelectric effect to vibrate. For example, the first and second vibration portions 10A and 10B can be disposed or tiled at a certain interval (or distance) D1. Accordingly, the vibration apparatus 4 in which the first and second vibration portions 10A and 10B are tiled can be referred to as a vibration array, a vibration array portion, a vibration module array portion, a vibration array structure, a tiling vibration array, a tiling vibration array module, or a tiling vibration film, but embodiments of the present disclosure are not limited thereto.

Each of the first and second vibration portions 10A and 10B according to an embodiment of the present disclosure can have a tetragonal shape. For example, each of the first and second vibration portions 10A and 10B can have a tetragonal shape having a width of about 5 cm or more. For example, each of the first and second vibration portions 10A and 10B can have a square shape having a size of 5 cm×5 cm or more, but embodiments of the present disclosure are not limited thereto.

Each of the first and second vibration portions 10A and 10B can be disposed or tiled on the same plane, and thus, the vibration apparatus 4 can have an enlarged area based on tiling of the first and second vibration portions 10A and 10B having a relatively small size.

Each of the first and second vibration portions 10A and 10B can be disposed or tiled at a certain interval (or distance) D1, and thus, can be implemented as one vibration apparatus (or a single vibration apparatus) which is driven as one complete single-body without being independently driven. According to an embodiment of the present disclosure, with respect to the first direction X, an interval (or a distance) D1 between the first and second vibration portions 10A and 10B can be 0.1 mm or more and less than 3 cm (e.g., 1.5 cm), but embodiments of the present disclosure are not limited thereto.

According to an embodiment of the present disclosure, each of the first and second vibration portions 10A and 10B can be disposed or tiled to have the interval D1 of 0.1 mm or more and less than 3 cm (e.g., 1.5 cm), and thus, can be driven as one vibration apparatus, thereby increasing a reproduction band of a sound and a sound pressure level characteristic of a sound which is generated based on a single-body vibration of the first and second vibration portions 10A and 10B. For example, the first and second vibration portions 10A and 10B can be disposed in the interval D1 of 0.1 mm or more and less than 5 mm (e.g., 0.25 mm), in order to increase a reproduction band of a sound generated based on a single-body vibration of the first and second vibration portions 10A and 10B and to increase a sound of a low-pitched sound band (for example, a sound pressure level characteristic in 500 Hz or less).

According to an embodiment of the present disclosure, when the first and second vibration portions 10A and 10B are disposed in the interval D1 of less than 0.1 mm or without the interval D1, the reliability of the first and second vibration portions 10A and 10B or the vibration apparatus 4 can be reduced due to damage or a crack caused by a physical contact therebetween which occurs when each of the first and second vibration portions 10A and 10B vibrates.

According to an embodiment of the present disclosure, when the first and second vibration portions 10A and 10B are disposed in the interval D1 of 3 cm or more, the first and second vibration portions 10A and 10B can not be driven as one vibration apparatus due to an independent vibration of each of the first and second vibration portions 10A and 10B. Therefore, a reproduction band of a sound and a sound pressure level characteristic of a sound which is generated based on vibrations of the first and second vibration portions 10A and 10B can be reduced. For example, when the first and second vibration portions 10A and 10B are disposed in the interval D1 of 3 cm or more, a sound characteristic and a sound pressure level characteristic of the low-pitched sound band (for example, in 500 Hz or less) can each be reduced. For example, if the first and second vibration portions 10A and 10B are spaced too far apart, then they can become out of synch, and if the first and second vibration portions 10A and 10B are spaced too close together, then they can damage each other and cause cracks.

According to an embodiment of the present disclosure, when the first and second vibration portions 10A and 10B are disposed in the interval D1 of 5 mm, each of the first and second vibration portions 10A and 10B can not be perfectly driven as one vibration apparatus, and thus, a sound characteristic and a sound pressure level characteristic of the low-pitched sound band (for example, in 200 Hz or less) can each be reduced.

According to another embodiment of the present disclosure, when the first and second vibration portions 10A and 10B are disposed in the interval D1 of 1 mm, each of the first and second vibration portions 10A and 10B can be driven as one vibration apparatus, and thus, a reproduction band of a sound can increase and a sound of the low-pitched sound band (for example, a sound pressure level characteristic in 500 Hz or less) can increase. For example, when the first and second vibration portions 10A and 10B are disposed in the interval D1 of 1 mm, the vibration apparatus 4 can be implemented as a large-area vibrator (e.g., a large speaker) which is enlarged based on optimization of a separation distance between the first and second vibration portions 10A and 10B. Therefore, the vibration apparatus 4 can be driven as a large-area vibrator based on a single-body vibration of the first and second vibration portions 10A and 10B, and thus, a sound characteristic and a sound pressure level characteristic can each increase in the low-pitched sound band and a reproduction band of a sound generated based on a large-area vibration of the vibration apparatus 4 can increase.

Therefore, to implement a single-body vibration (or one vibration apparatus) of the first and second vibration portions 10A and 10B, the interval D1 between the first and second vibration portions 10A and 10B can be adjusted to 0.1 mm or more and less than 3 cm (e.g., 1.5 cm). In addition, to implement a single-body vibration (or one vibration apparatus) of the first and second vibration portions 10A and 10B and to increase a sound pressure level characteristic of a sound of the low-pitched sound band, the interval D1 between the first and second vibration portions 10A and 10B can be adjusted to 0.1 mm or more and less than 5 mm (e.g., 2.5 mm).

Each of the first and second vibration portions 10A and 10B according to an embodiment of the present disclosure can include a vibration layer 11, a first electrode layer 13, and a second electrode layer 15. Each of the vibration layer 11, the first electrode layer 13, and the second electrode layer 15 can be configured substantially the same as each of the vibration layer 11, the first electrode layer 13, and the second electrode layer 15 described above with reference to FIGS. 1 to 4, and thus, like reference numerals referring to like elements and their repetitive descriptions can be omitted.

According to an embodiment of the present disclosure, each of the first and second vibration portions 10A and 10B can include any one vibration layer 11 of the vibration layer 11 described above with reference to FIGS. 10 to 13, or can include a different vibration layer 11 having a different type of configuration.

The first cover member 30 can be disposed at a first surface of each of the first and second vibration portions 10A and 10B. The first cover member 30 can be configured to cover a first electrode layer 13 of each of the first and second vibration portions 10A and 10B and can be commonly connected to the first surface of each of the first and second vibration portions 10A and 10B. Accordingly, the first cover member 30 can protect the first surface or the first electrode layer 13 of each of the first and second vibration portions 10A and 10B. For example, except for that the first cover member 30 being connected to the first surface of each of the first and second vibration portions 10A and 10B in common, as shown in FIGS. 15 and 16, the first cover member 30 can be substantially the same as the first cover member 30 described above with reference to FIGS. 1 to 9, and thus, descriptions (or details) of the first cover member 30 illustrated in FIGS. 1 to 9 can be included in descriptions (or details) of the first cover member 30 illustrated in FIGS. 14 to 16 and the repetitive description thereof can be omitted.

The first cover member 30 can be disposed at the first surface of each of the first and second vibration portions 10A and 10B by a first adhesive layer 41. For example, the first cover member 30 can be disposed at the first surface of each of the first and second vibration portions 10A and 10B by a film laminating process using the first adhesive layer 41. Therefore, each of the first and second vibration portions 10A and 10B can be integrated (or disposed) or tiled to the first cover member 30 to have a certain interval (or a distance) D1.

The second cover member 50 can be disposed at a second surface of each of the first and second vibration portions 10A and 10B. For example, the second cover member 50 can be configured to cover a second electrode layer 15 of each of the first and second vibration portions 10A and 10B and can be commonly connected to the second surface of each of the first and second vibration portions 10A and 10B. Accordingly, the second cover member 50 can protect the second surface or the second electrode layer 15 of each of the first and second vibration portions 10A and 10B. For example, except for that the second cover member 50 being connected to the second surface of each of the first and second vibration portions 10A and 10B in common, as shown in FIGS. 15 and 16, the second cover member 50 can be substantially the same as the second cover member 50 described above with reference to FIGS. 1 to 9, and thus, descriptions (or details) of the second cover member 50 illustrated in FIGS. 1 to 9 can be included in descriptions (or details) of the second cover member 50 illustrated in FIGS. 14 to 16 and the repetitive description thereof can be omitted.

The second cover member 50 can be disposed at the second surface of each of the first and second vibration portions 10A and 10B by a second adhesive layer 42. For example, the second cover member 50 can be disposed at the second surface of each of the first and second vibration portions 10A and 10B by a film laminating process using the second adhesive layer 42. Therefore, each of the first and second vibration portions 10A and 10B can be integrated (or disposed) or tiled to the second cover member 50 to have a certain interval (or a distance) D1.

The contact portion 70 can be disposed at the one periphery portion EP of the first cover member 30 and can be configured to be electrically connected to each of the first and second vibration portions 10A and 10B. For example, a portion of the contact portion 70 can be provided to overlap or stack with each of the first and second vibration portions 10A and 10B.

The contact portion 70 according to an embodiment of the present disclosure can include a first contact member 70A and a second contact member 70B.

The first contact member 70A can be disposed at the one periphery portion EP of the first cover member 30 adjacent to the first vibration portion 10A. The first contact member 70A can be provided in an island shape at the one periphery portion EP of the first cover member 30 adjacent to the first vibration portion 10A. For example, a portion of the first contact member 70A can overlap or stack with a portion of the first vibration portion 10A. For example, a portion of the first contact member 70A can electrically contact a portion of the first vibration portion 10A. For example, more specifically, a portion of the first contact member 70A can electrically contact the first electrode layer 13 of the first vibration portion 10A. For example, half of the first contact member 70A can directly contact the first electrode layer 13 of the first vibration portion 10A. The other portion of the first contact member 70A can not overlap or stack with the first vibration portion 10A and can be exposed at one periphery portion of the first cover member 30 (e.g., about half of the first contact member 70A can stick out from under the first vibration portion 10A, similar to a tab type of structure).

The second contact member 70B can be disposed at the one periphery portion EP of the first cover member 30 adjacent to the second vibration portion 10B. The second contact member 70B can be provided in an island shape at the one periphery portion EP of the first cover member 30 adjacent to the second vibration portion 10B. For example, a portion of the second contact member 70B can overlap or stack a portion of the second vibration portion 10B. For example, a portion of the second contact member 70B can electrically contact a portion of the second vibration portion 10B. For example, more specifically, a portion of the second contact member 70B can electrically contact the first electrode layer 13 of the second vibration portion 10B. For example, half of the second contact member 70B can directly contact the first electrode layer 13 of the second vibration portion 10B. The other portion of the second contact member 70B can not overlap or stack the second vibration portion 10B and can be exposed at one periphery portion of the first cover member 30 (e.g., about half of the second contact member 70B can stick out from under the second vibration portion 10B, similar to a tab type of structure).

Each of the first contact member 70A and the second contact member 70B can include a conductive double-sided adhesive member. Each of the first contact member 70A and the second contact member 70B can include a conductive double-sided tape, a conductive double-sided adhesive pad, or a conductive double-sided cushion tape, but embodiments of the present disclosure are not limited thereto. Each of the first contact member 70A and the second contact member 70B, as illustrated in FIG. 2, can include the metal layer 71, the first tacky layer 72 (e.g., a first adhesive layer), and a second tacky layer 73 (e.g., a second adhesive layer), and thus, their repetitive descriptions can be omitted.

The signal cable 90 can be electrically connected to each of the first and second electrode layers 13 and 15 of each of the first and second vibration portion 10A and 10B at one side of the vibration portion 10. An end portion (or a distal end portion) of the signal cable 90 can be disposed at or inserted into a region (or a portion) between the one periphery portion EP of the first cover member 30 and the one periphery portion EP of the second cover member 50. The one periphery portion EP of the first cover member 30 and the one periphery portion EP of the second cover member 50 can accommodate a portion of the signal cable 90, or can vertically cover a portion of the signal cable 90.

The signal cable 90 according to an embodiment of the present disclosure can include a base member 91 and first to fourth signal lines 92a to 92d. For example, except for that the signal cable 90 includes the first to fourth signal lines 92a to 92d individually connected to each of first and second electrode layers 13 and 15 of each of the first and second vibration portions 10A and 10B, the signal cable 90 can be substantially the same as the signal cable 90 described above with reference to FIGS. 1 to 4, and thus, their repetitive descriptions can be omitted or will be briefly given below.

The base member 91 can include a transparent or opaque plastic material. The base member 91 can have a certain width in a first direction X and can extend long along a second direction Y intersecting with the first direction X.

The first signal line 92a can be disposed at a first surface of the base member 91 in parallel with the second direction Y. The first signal line 92a can be electrically connected to or contacted with the first electrode layer 13 of the first vibration portion 10A through the first contact member 70A. Except for that the first signal line 92a is electrically connected to or contacted with the first electrode layer 13 of the first vibration portion 10A through the first contact member 70A, the first signal line 92a can be substantially the same as the first signal line 92a described above with reference to FIGS. 1 to 4, and thus, the repetitive description thereof can be omitted or will be briefly given below.

The second signal line 92b can be disposed at the first surface of the base member 91 in parallel with the second direction Y. The second signal line 92b can be electrically connected to or contacted with the second electrode layer 15 of the first vibration portion 10A. Except for that the second signal line 92b is electrically connected to the second electrode layer 15 of the first vibration portion 10A, the second signal line 92b can be substantially the same as the second signal line 92b described above with reference to FIGS. 1 to 4, and thus, the repetitive description thereof can be omitted or will be briefly given below.

A third signal line 92c can be disposed on a first surface of the base member 91 in parallel with the second direction Y (e.g., see FIGS. 14 and 16). The third signal line 92c can be electrically connected to or contacted with the first electrode layer 13 of the second vibration portion 10B through the second contact member 70B. Except for that the third signal line 92c is electrically connected to or contacted with the first electrode layer 13 of the second vibration portion 10B through the second contact member 70B, the third signal line 92c can be substantially the same as the first signal line 92a, and thus, the repetitive description thereof can be omitted or will be briefly given below.

A fourth signal line 92d can be disposed on a first surface of the base member 91 in parallel with the second direction Y (e.g., see FIGS. 14 and 16). The fourth signal line 92d can be disposed between the second signal line 92b and the third signal line 92c. The fourth signal line 92d can be electrically connected to or contacted with the second electrode layer 15 of the second vibration portion 10B. Except for that the fourth signal line 92d is electrically connected to the second electrode layer 15 of the second vibration portion 10B, the fourth signal line 92d can be substantially the same as the second signal line 92b, and thus, the repetitive description thereof can be omitted or will be briefly given below.

The first signal line 92a and the second signal line 92b can have different lengths. For example, the second signal line 92b can more extend from an end of the first signal line 92a. The third signal line 92c and the fourth signal line 92d can have different lengths. For example, the fourth signal line 92d can more extend from an end of the third signal line 92c. Accordingly, a first portion (or a middle portion) of the base member 91 overlapping each of the second signal line 92b and the fourth signal line 92d can more extend from an end of each of the first signal line 92a and the third signal line 92c, and thus, the base member 91 or the signal cable 90 can include an extension portion 90a corresponding to an end portion of each of the second signal line 92b and the fourth signal line 92d. Also, the second signal line 92b and the fourth signal line 92d can be disposed between the first signal line 92a and the third signal line 92c, in a butterfly type of configuration that is symmetrical with respect to a center of the signal cable 90.

An end portion (or a distal end portion) of the first signal line 92a can be electrically connected to the first contact member 70A of the contact portion 70. For example, the end portion (or the distal end portion) of the first signal line 92a can be directly connected to the first contact member 70A at the one periphery portion EP of the first cover member 30. The first signal line 92a can be attached on or contacted with the first tacky layer 72 of the first contact member 70A, and thus, can be electrically connected to or contacted with the first electrode layer 13 of the first vibration portion 10A through the first tacky layer 72 and/or the metal layer 71 of the first contact member 70A. Accordingly, the first signal line 92a can supply the first electrode layer 13 of the first vibration portion 10A with a driving signal supplied from a vibration driving circuit.

An end portion (or a distal end portion) of the second signal line 92b can be electrically connected to or contacted with the second electrode layer 15 of the first vibration portion 10A. For example, the extension portion 90a of the signal cable 90 can pass through the one periphery portion EP of the second cover member 50 and can be disposed between the second cover member 50 and the first vibration portion 10A, and the second signal line 92b disposed at the extension portion 90a can be directly connected to or contacted with the second electrode layer 15 of the first vibration portion 10A. Accordingly, the second signal line 92b can supply the second electrode layer 15 of the first vibration portion 10A with the driving signal supplied from the vibration driving circuit.

An end portion (or a distal end portion) of the third signal line 92c can be electrically connected to the second contact member 70B of the contact portion 70. For example, the end portion (or the distal end portion) of the third signal line 92c can be directly connected to the second contact member 70B at the one periphery portion EP of the first cover member 30. The third signal line 92c can be attached on or contacted with the first tacky layer 72 of the second contact member 70B, and thus, can be electrically connected to or contacted with the first electrode layer 13 of the second vibration portion 10B through the first tacky layer 72 and/or the metal layer 71 of the second contact member 70B. Accordingly, the third signal line 92c can supply the first electrode layer 13 of the second vibration portion 10B with a driving signal supplied from a vibration driving circuit.

An end portion (or a distal end portion) of the fourth signal line 92d can be electrically connected to or contacted with the second electrode layer 15 of the second vibration portion 10B. For example, the extension portion 90a of the signal cable 90 can pass through the one periphery portion EP of the second cover member 50 and can be disposed between the second cover member 50 and the second vibration portion 10B, and the fourth signal line 92d disposed at the extension portion 90a can be directly connected to or contacted with the second electrode layer 15 of the second vibration portion 10B. Accordingly, the fourth signal line 92d can supply the second electrode layer 15 of the second vibration portion 10B with the driving signal supplied from the vibration driving circuit.

The signal cable 90 according to an embodiment of the present disclosure can further include an insulation layer 93.

The insulation layer 93 can be disposed at the first surface of the base member 91 to cover each of the first to fourth signal lines 92a to 92d other than the end portion (or the distal end portion) of the signal cable 90. The insulation layer 93 can be a protective layer, a cover layer, a cover layer film, a cover film, or a cover insulation film, but embodiments are not limited thereto.

The end portion (or the distal end portion) of the signal cable 90 inserted between the first cover member 30 and the second cover member 50 can be inserted or fixed between the first cover member 30 and the second cover member 50 by a film laminating process which uses a first adhesive layer 41 formed in the first cover member 30 and a second adhesive layer 42 formed in the second cover member 50. Therefore, the first signal line 92a and the third signal line 92c can be stably maintained in place while being electrically connected to the contact portion 70, and the second signal line 92b and the fourth signal line 92d can be stably maintained in place while being electrically connected to the second electrode layer 15 of the vibration portion 10. In addition, the end portion (or the distal end portion) of the signal cable 90 can be inserted or fixed between the first cover member 30 and the second cover member 50, and thus, a contact defect between the vibration portion 10 and the signal cable 90 caused by the movement of the signal cable 90 can be prevented.

According to an embodiment of the present disclosure, the crack or damage of the vibration portion 10 occurring in a film laminating process can be prevented or minimized.

In the vibration apparatus 4 according to the fourth embodiment of the present disclosure, a soldering process for an electrical connection between the vibration portion 10 and the signal cable 90 can not be needed, thereby simplifying a manufacturing process and a structure of the vibration apparatus 4, an electrical characteristic, such as a resistivity, or the like, of the first and second electrode layers 13 and 15 can be complemented. In addition, the vibration apparatus 4 according to the fourth embodiment of the present disclosure can include the first and second vibration portions 10A and 10B which are arranged (or tiled) at a certain interval D1, to be implemented as one single vibration body without being independently driven, and thus, can be driven as a large-area vibration body based on a single-body vibration of the first and second vibration portions 10A and 10B.

Figure 17:
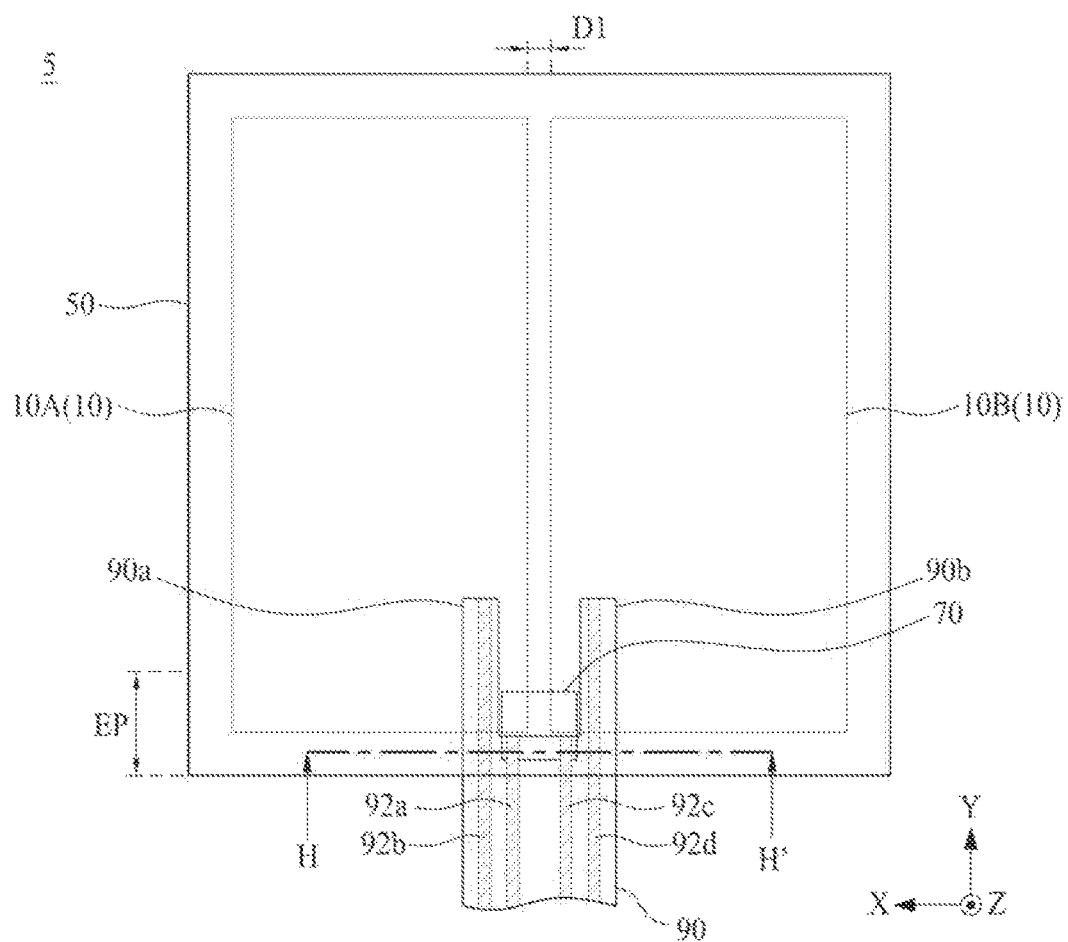
FIG. 17 illustrates a vibration apparatus according to another embodiment of the present disclosure.
Figure 18:
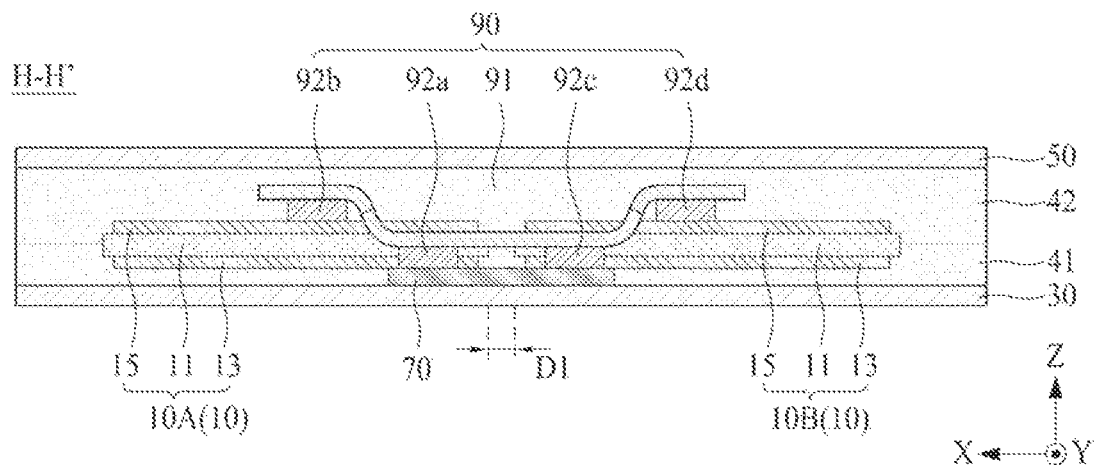
FIG. 18 is a cross-sectional view taken along line H-H' illustrated in FIG. 17 according to an embodiment of the present disclosure.

FIG. 17 illustrates a vibration apparatus according to a fifth embodiment of the present disclosure. FIG. 18 is a cross-sectional view taken along line H-H' illustrated in FIG. 17. FIGS. 17 and 18 illustrate an embodiment implemented by modifying the contact portion and the signal cable in the vibration apparatus 4 described above with reference to FIGS. 14 to 16. In descriptions of FIGS. 17 and 18, therefore, the other elements except a contact portion, a signal cable, and relevant elements are referred to by like reference numerals and their repetitive descriptions can be omitted. For example, the fifth embodiment is similar to the fourth embodiment, except the first signal line 92*a* and the third signal line 92*b* can be disposed between the second signal line 92*b* and the fourth signal line 92*d*, in a butterfly type of configuration that is symmetrical with respect to a center of the signal cable 90. Also, where the fifth embodiment uses two tab structures for the first and second the contact members 70A and 70B, the sixth embodiment can use a single contact portion 70.

With reference to FIGS. 17 and 18, in a vibration apparatus 5 according to a fifth embodiment of the present disclosure, a contact portion 70 can be configured in an island shape at the one periphery portion EP of a first cover member 30 to overlap first and second vibration portions 10A and 10B. For example, the contact portion 70 can overlap or stack with a portion of each of the first and second vibration portions 10A and 10B in common. For example, a portion of the contact portion 70 can electrically contact a portion of each of the first and second vibration portions 10A and 10B. For example, a portion of the contact portion 70 can electrically contact the first electrode layer 13 of each of the first and second vibration portions 10A and 10B. For example, half of the contact portion 70 can directly contact the first electrode layer 13 of each of the first and second vibration portions 10A and 10B. The other portion of the contact portion 70 can not overlap or stack with each of the first and second vibration portions 10A and 10B and can be exposed at one periphery portion of the first cover member 30.

The signal cable 90 can differ from the signal cable 90 described above with reference to FIGS. 14 to 16 in that first and third signal lines 92*a* and 92*c* are connected to or contacted with the contact portion 70 in common and each of second and fourth signal lines 92*b* and 92*d* is connected to or contacted with a second electrode layer 15 of each of the first and second vibration portions 10A and 10B.

The first and third signal lines 92*a* and 92*c* can be arranged in parallel at a middle portion of a first surface of a base member 91. The second and fourth signal lines 92*b* and 92*d* can be arranged in parallel at both periphery portions of the first surface of the base member 91. For example, the second and fourth signal lines 92*b* and 92*d* can be disposed in parallel with the first and third signal lines 92*a* and 92*c* therebetween.

The both periphery portions of the base member 91 respectively overlapping the second and fourth signal lines 92*b* and 92*d* can extend further than ends of each of the first and third signal lines 92*a* and 92*c*, and thus, the base member 91 or the signal cable 90 can include a pair of extension portions 90*a* and 90*b* corresponding to end portions of each of the second and fourth signal lines 92*b* and 92*d*. The pair of extension portions 90*a* and 90*b* can extend in a second direction Y with the middle portion of the base member 91 therebetween.

An end portion (or a distal end portion) of each of the first and third signal lines 92*a* and 92*c* can be electrically connected to the contact portion 70. For example, the end portion (or the distal end portion) of each of the first and third signal lines 92*a* and 92*c* can be directly connected to the contact portion 70 at the one periphery portion EP of the first cover member 30. Each of the first and third signal lines 92*a* and 92*c* can be attached on or contacted with the first tacky layer 72 of the contact portion 70, and thus, can be electrically connected to or contacted with the first electrode layer 13 of each of the first and second vibration portions 10A and 10B through the first tacky layer 72 and/or the metal layer 71 of the contact portion 70. Accordingly, each of the first and third signal lines 92*a* and 92*c* can supply the first electrode layer 13 of each of the first and second vibration portions 10A and 10B with a driving signal supplied from a vibration driving circuit.

Optionally, each of the first and third signal lines 92*a* and 92*c* can be connected to the contact portion 70 in common and the contact portion 70 can be connected to or contacted with the first electrode layer 13 of each of the first and second vibration portions 10A and 10B, and thus, any one of the first and third signal lines 92*a* and 92*c* can be omitted or combined as a single signal line, thereby decreasing a size (or a width) of the signal cable 90.

An end portion (or a distal end portion) of the second signal line 92*b* can be electrically connected to or contacted with the second electrode layer 15 of the first vibration portion 10A. For example, the extension portion (or a first extension portion) 90*a* of the signal cable 90 can pass through the one periphery portion EP of the second cover member 50 and can be disposed between the second cover member 50 and the first vibration portion 10A, and the second signal line 92*b* disposed at the extension portion (or the first extension portion) 90*a* can be directly connected to or contacted with the second electrode layer 15 of the first vibration portion 10A. Accordingly, the second signal line 92*b* can supply the second electrode layer 15 of the first vibration portion 10A with the driving signal supplied from the vibration driving circuit.

An end portion (or a distal end portion) of the fourth signal line 92*d* can be electrically connected to or contacted with the second electrode layer 15 of the second vibration portion 10B. For example, the extension portion (or a second extension portion) 90*b* of the signal cable 90 can pass through the one periphery portion EP of the second cover member 50 and can be disposed between the second cover member 50 and the second vibration portion 10B, and the fourth signal line 92*d* disposed at the extension portion (or the second extension portion) 90*b* can be directly connected to or contacted with the second electrode layer 15 of the second vibration portion 10B. Accordingly, the fourth signal line 92*d* can supply the second electrode layer 15 of the second vibration portion 10B with the driving signal supplied from the vibration driving circuit.

The vibration apparatus 5 according to the fifth embodiment of the present disclosure can have or provide the same effect as the vibration apparatus 4 according to the fourth embodiment of the present disclosure, but can include one contact portion 70 which contacts first and second vibration portions 10A and 10B in common (e.g., rather than having the two tab structures for the first and second the contact members 70A and 70B as in the fourth embodiment), and thus, a manufacturing process and a structure of the vibration apparatus 5 can be further simplified.

Figure 19:
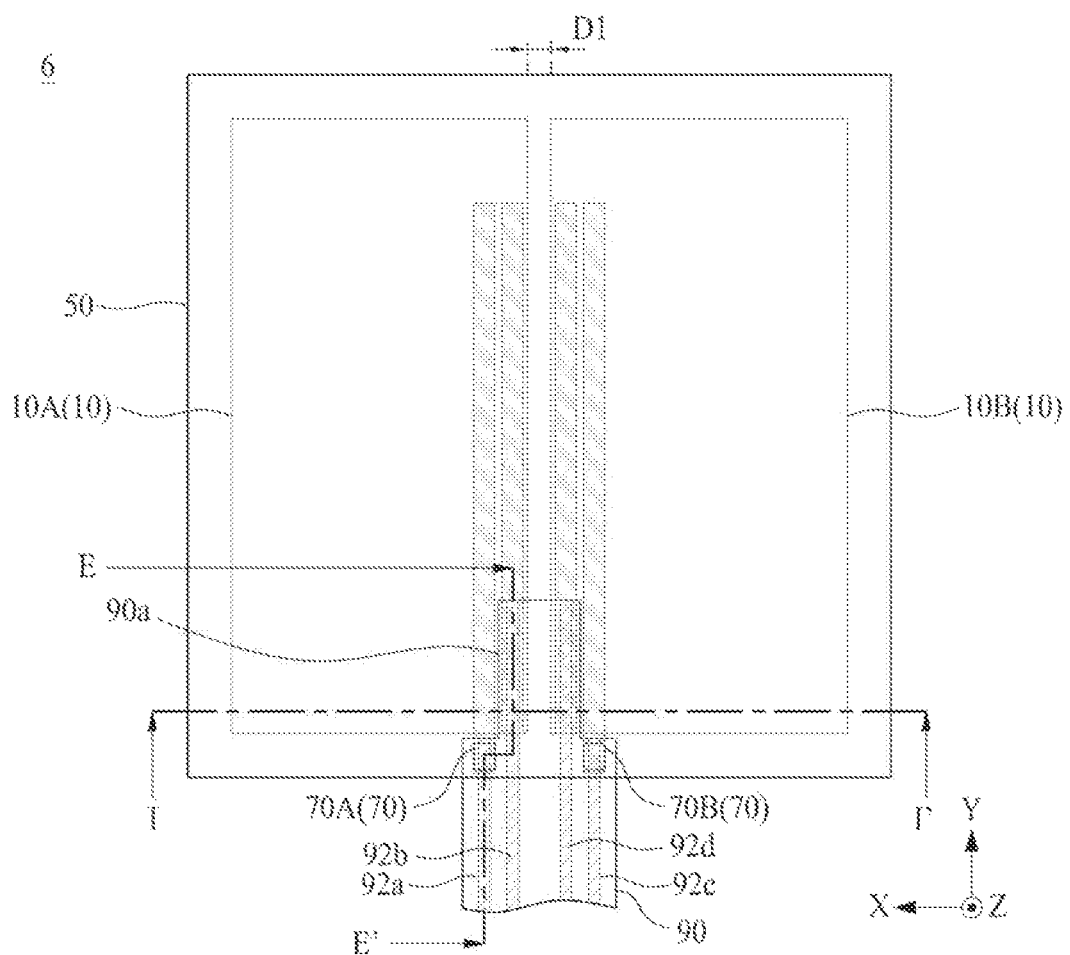
FIG. 19 illustrates a vibration apparatus according to another embodiment of the present disclosure.
Figure 20:
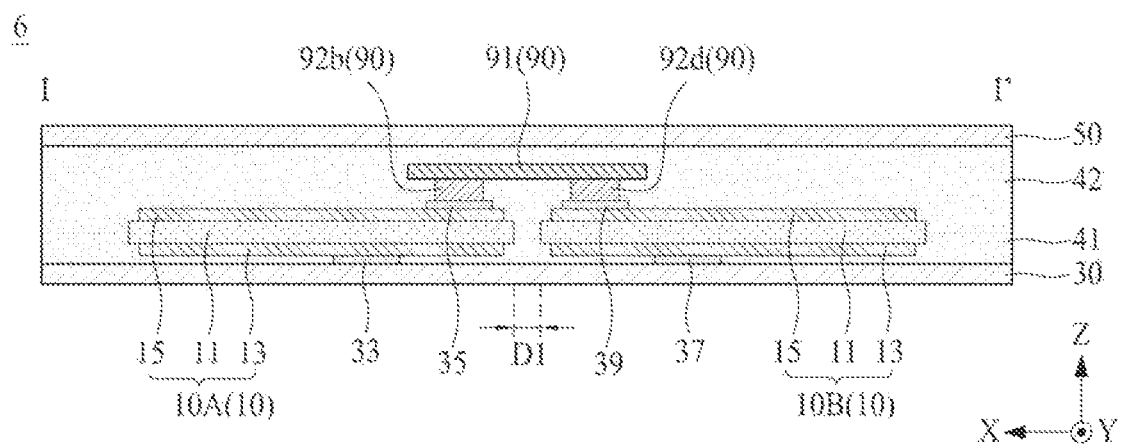
FIG. 20 is a cross-sectional view taken along line I-I' illustrated in FIG. 19 according to an embodiment of the present disclosure.

FIG. 19 illustrates a vibration apparatus according to a sixth embodiment of the present disclosure. FIG. 20 is a cross-sectional view taken along line I-I' illustrated in FIG. 19. FIGS. 19 and 20 illustrate an embodiment where a metal line is additionally configured in the vibration apparatus described above with reference to FIGS. 14 to 16. In descriptions of FIGS. 19 and 20, therefore, the other elements except a metal line and relevant elements are referred to by like reference numerals and repetitive descriptions thereof can be omitted. A cross-sectional view taken along line E-E' illustrated in FIG. 19 is illustrated in FIG. 7. For example, the sixth embodiment is similar to the second embodiment (e.g., FIGS. 5-7), except that the configuration is doubled to provide first, second, third and fourth metal lines 33, 35, 37, and 39 that are arranged in a butterfly type of configuration that is symmetrical with respect to a center of the signal cable 90.

With reference to FIGS. 7, 19, and 20, a vibration apparatus 6 according to a sixth embodiment of the present disclosure can include first, second, third and fourth metal lines 33, 35, 37, and 39.

The first metal line 33 can be disposed at a first cover member 30 and can be electrically connected to or contacted with a first electrode layer 13 of a first vibration portion 10A. For example, the first metal line 33 can be disposed close to a center portion of the first vibration portion 10A. Except for that the first metal line 33 is provided at the first cover member 30 to be connected to or contacted with the first electrode layer 13 of the first vibration portion 10A, the first metal line 33 can be substantially the same as the first metal line 33 described above with reference to FIGS. 5 to 7, and thus, descriptions (or details) of the first metal line 33 illustrated in FIGS. 5 to 7 can be included in descriptions (or details) of the first metal line 33 illustrated in FIGS. 19 and 20 and the repetitive descriptions thereof can be omitted.

The first metal line 33 can be electrically connected to or contacted with a first signal line 92a of a signal cable 90 through a first contact member 70A of a contact portion 70 at the one periphery portion EP of the first cover member 30. Therefore, the first signal line 92a can be electrically connected to or contacted with the first electrode layer 13 of the first vibration portion 10A through the first contact member 70A of the contact portion 70 and the first metal line 33, thereby transferring or supplying the driving signal supplied from the vibration driving circuit to the first electrode layer 13 of the first vibration portion 10A.

In the vibration apparatus 6 according to the sixth embodiment of the present disclosure, the first contact member 70A of the contact portion 70 can be disposed or interposed between the first metal line 33 and the first signal line 92a. The first contact member 70A of the contact portion 70 can be implemented to electrically connect to or contact with the first metal line 33 and the first signal line 92a and can be spaced apart from the first vibration portion 10A without electrically contacting the first vibration portion 10A in the one periphery portion EP of the first cover member 30.

The second metal line 35 can be disposed between a second electrode layer 15 of the first vibration portion 10A and a second cover member 50 and can be electrically connected to or contacted with the second electrode layer 15 of the first vibration portion 10A. For example, the second metal line 35 can be formed to directly contact the second electrode layer 15 of the first vibration portion 10A without a medium. For example, the second metal line 35 can be disposed close to the center portion of the first vibration portion 10A. Except for that the second metal line 35 is provided at the second electrode layer 15 of the first vibration portion 10A, the second metal line 35 can be substantially the same as the second metal line 35 described above with reference to FIGS. 5 to 7, and thus, descriptions (or details) of the second metal line 35 illustrated in FIGS. 5 to 7 can be included in descriptions (or details) of the second metal line 35 illustrated in FIGS. 19 and 20 and the repetitive description thereof can be omitted.

The third metal line 37 can be disposed at a first cover member 30 and can be electrically connected to or contacted with a first electrode layer 13 of a second vibration portion 10B. The third metal line 37 can be disposed at the first cover member 30 in parallel with the first metal line 33. For example, the third metal line 37 can be disposed close to a center portion of the vibration portion 10. Except for that the third metal line 37 is provided at the first cover member 30 to be connected to or contacted with the first electrode layer 13 of the second vibration portion 10B, the third metal line 37 can be substantially the same as the first metal line 33, and thus, the repetitive descriptions thereof can be omitted.

The third metal line 37 can be electrically connected to or contacted with a third signal line 92c of a signal cable 90 through a second contact member 70B of the contact portion 70 at the one periphery portion EP of the first cover member 30. Therefore, the third signal line 92c can be electrically connected to or contacted with the first electrode layer 13 of the second vibration portion 10B through the second contact member 70B of the contact portion 70 and the third metal line 37, thereby transferring or supplying the driving signal supplied from the vibration driving circuit to the first electrode layer 13 of the second vibration portion 10B.

In the vibration apparatus 6 according to the sixth embodiment of the present disclosure, the second contact member 70B of the contact portion 70 can be disposed or interposed between the third metal line 37 and the third signal line 92c. The second contact member 70B of the contact portion 70 can be implemented to electrically connect to or contact with the third metal line 37 and the third signal line 92c and can be spaced apart from the second vibration portion 10B without electrically contacting the second vibration portion 10B in the one periphery portion EP of the first cover member 30.

The fourth metal line 39 can be disposed between a second electrode layer 15 of the second vibration portion 10B and the second cover member 50 and can be electrically connected to or contacted with the second electrode layer 15 of the second vibration portion 10B. The fourth metal line 39 can be disposed at the second electrode layer 15 of the second vibration portion 10B in parallel with the second metal line 35. For example, the fourth metal line 39 can be formed to directly contact the second electrode layer 15 of the second vibration portion 10B without a medium. For example, the fourth metal line 39 can be disposed close to the center portion of the second vibration portion 10B. Except for that the fourth metal line 39 is provided at the second electrode layer 15 of the second vibration portion 10B, the fourth metal line 39 can be substantially the same as the second metal line 35, and thus, the repetitive description thereof can be omitted. For example, the second and fourth metal lines 35 and 39 can be disposed between the first and third metal lines 33 and 37, and the second and fourth metal lines 35 and 39 can be disposed on the top of the corresponding vibration portion, and the first and third metal lines 33 and 37 can be disposed under the corresponding vibration portion.

The vibration apparatus 6 according to the sixth embodiment of the present disclosure can have or provide the same effect as the vibration apparatus 4 according to the fourth embodiment of the present disclosure. In the vibration apparatus 6 according to the sixth embodiment of the present disclosure, the driving signal can be supplied to the first electrode layer 13 and the second electrode layer 15 of each of the first and second vibration portions 10A and 10B through the metal lines 33, 35, 37, and 39 having a low resistivity, and thus, an electrical characteristic, such as a resistivity, or the like, of the first and second electrode layers 13 and 15 can be complemented.

Figure 21:
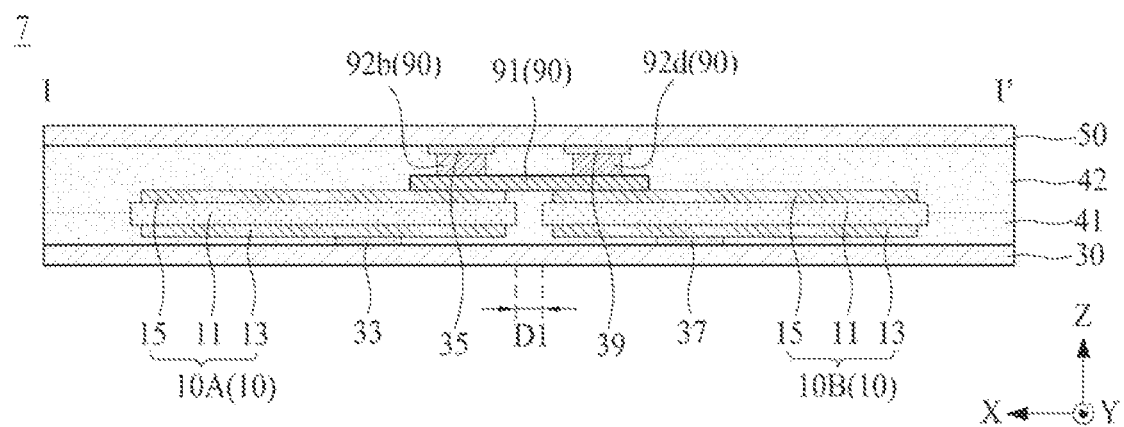
FIG. 21 is another cross-sectional view taken along line I-I' illustrated in FIG. 19 according to an embodiment of the present disclosure.

FIG. 21 is another cross-sectional view taken along line I-I' illustrated in FIG. 19. FIG. 21 is a diagram for describing a vibration apparatus according to a seventh embodiment of the present disclosure. Another cross-sectional view taken along line E-E' illustrated in FIG. 19 is illustrated in FIG. 19.

With reference to FIGS. 9, 20, and 21, a vibration apparatus 7 according to a seventh embodiment of the present disclosure can be implemented by modifying the second and fourth metal lines in the vibration apparatus 6 described above with reference to FIGS. 19 and 20. In descriptions of FIGS. 9, 20, and 21, therefore, the other elements except second and fourth metal lines and relevant elements are referred to by like reference numerals and their repetitive descriptions can be omitted.

The second metal line 35 can be disposed at a second cover member 50 and can be electrically connected to or contacted with the second electrode layer 15 of the first vibration portion 10A. For example, the second metal line 35 can extend long along the second direction Y from the one periphery portion EP of the second cover member 50 to overlap the first vibration portion 10A. The second metal line 35 can be substantially the same as the second metal line 35 described above with reference to FIGS. 5, 8, and 9, and thus, the repetitive description thereof can be omitted.

The fourth metal line 39 can be disposed at a second cover member 50 and can be electrically connected to or contacted with the second electrode layer 15 of the second vibration portion 10B. For example, the fourth metal line 39 can extend long along the second direction Y from the one periphery portion EP of the second cover member 50 to overlap the second vibration portion 10B. The fourth metal line 39 can be disposed at a second cover member 50 in parallel with the second metal line 35. Except for that the fourth metal line 39 is electrically connected to or contacted with the second electrode layer 15 of the second vibration portion 10B, the fourth metal line 39 can be substantially the same as the second metal line 35, and thus, the repetitive description thereof can be omitted.

A second and fourth signal lines 92b and 92d of a signal cable 90 can be disposed at a second surface, which is opposite to a first surface, of a base member 91. For example, the signal cable 90 can include a double-sided line structure. The second and fourth signal lines 92b and 92d can be covered by a second insulation layer 94 (e.g., see the insulation structure in FIG. 9, which can be applied to the signal lines in FIG. 19).

An end portion (or a distal end portion) of the second signal line 92b can be disposed or inserted between the one periphery portion EP of the second cover member 50 and the first vibration portion 10A and can be electrically connected to or contacted with the second metal line 35. An end portion (or a distal end portion) of the fourth signal line 92d can be disposed or inserted between the one periphery portion EP of the second cover member 50 and the second vibration portion 10B and can be electrically connected to or contacted with the fourth metal line 39.

The one periphery portion of the second metal line 35 disposed at the one periphery portion EP of the second cover member 50 can be electrically connected to or contacted with the second signal line 92b of the signal cable 90. The other portion, except the one periphery portion, of the second metal line 35 can be electrically connected to or contacted with the second electrode layer 15 of the first vibration portion 10A by a film laminating process using a second adhesive layer 42. For example, the other portion, except the one periphery portion, of the second metal line 35 can be electrically connected to or contacted with the second electrode layer 15 of the first vibration portion 10A through pressing of the second cover member 50 based on a film laminating process. The second cover member 50 can have flexibility, and thus, can be bent in a curved shape at a stepped portion between the end portion of the second signal line 92b and the second electrode layer 15 of the first vibration portion 10A, whereby the second metal line 35 can be bent toward the second electrode layer 15 of the first vibration portion 10A as the second cover member 50 is bent.

The one periphery portion of the fourth metal line 39 disposed at the one periphery portion EP of the second cover member 50 can be electrically connected to or contacted with the fourth signal line 92d of the signal cable 90. The other portion, except the one periphery portion, of the fourth metal line 39 can be electrically connected to or contacted with the second electrode layer 15 of the second vibration portion 10B by a film laminating process using a second adhesive layer 42. For example, the other portion, except the one periphery portion, of the fourth metal line 39 can be electrically connected to or contacted with the second electrode layer 15 of the second vibration portion 10B through pressing of the second cover member 50 based on a film laminating process. The second cover member 50 can have flexibility, and thus, can be bent in a curved shape at a stepped portion between the end portion of the fourth signal line 92d and the second electrode layer 15 of the second vibration portion 10B, whereby the fourth metal line 39 can be bent toward the second electrode layer 15 of the second vibration portion 10B as the second cover member 50 is bent.

In the vibration apparatus 7 according to the seventh embodiment of the present disclosure, a soldering process for an electrical connection between the vibration portion 10 and the signal cable 90 can not be needed, thereby simplifying a manufacturing process and a structure of the vibration apparatus 2. In addition, in the vibration apparatus 7 according to the seventh embodiment of the present disclosure, the driving signal can be supplied to the first electrode layer 13 and the second electrode layer 15 of each of the first and second vibration portions 10A and 10B through the metal lines 33, 35, 37, and 39 having a low resistivity, and thus, an electrical characteristic, such as a resistivity, or the like, of the first and second electrode layers 13 and 15 can be complemented. In addition, in the vibration apparatus 7 according to the seventh embodiment of the present disclosure, comparing with the vibration apparatus 6 according to the sixth embodiment of the present disclosure, all of the first to fourth metal lines 33, 35, 37, and 39 can be disposed in corresponding cover members 30 and 50, and thus, a manufacturing process can be more simplified. For example, the first to fourth metal lines 33, 35, 37, and 39 can be disposed on the outer sides of the vibration apparatus 7, while the vibration portions and the signal cable are disposed more inside toward a center of the vibration apparatus.

Figure 22:
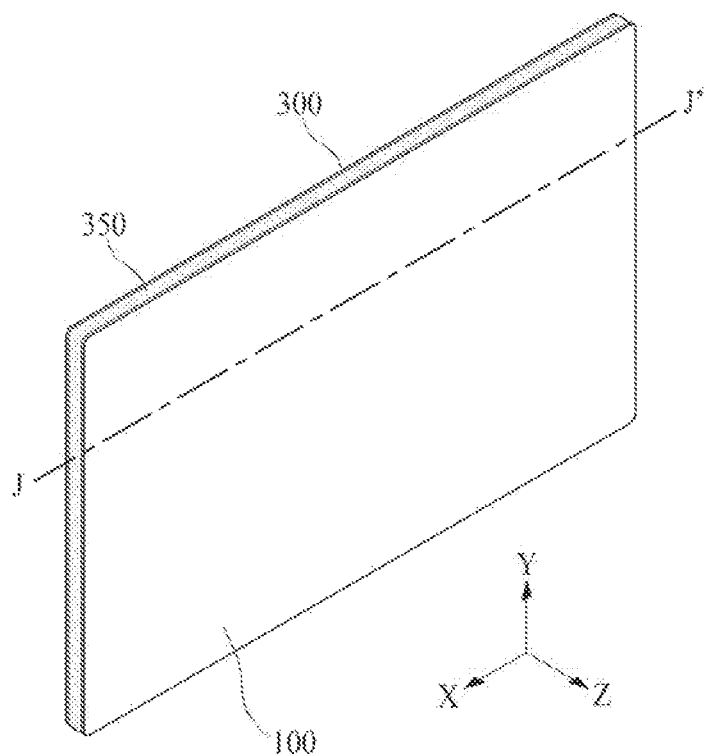
FIG. 22 illustrates an apparatus according to an embodiment of the present disclosure.
Figure 23:
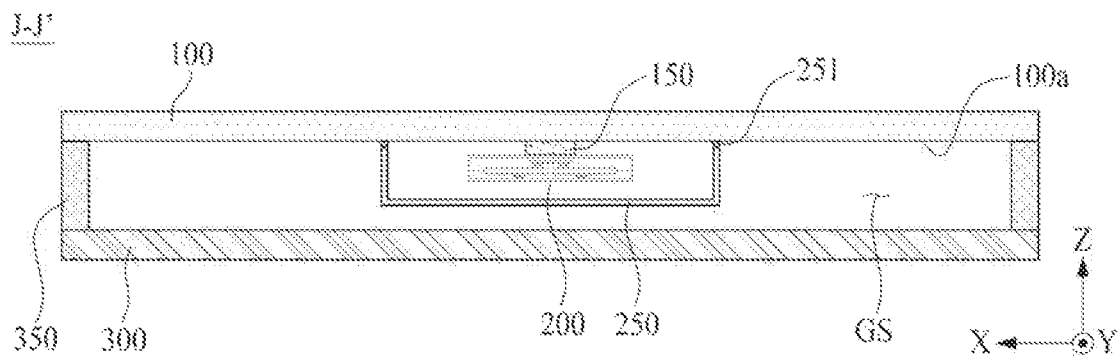
FIG. 23 is a cross-sectional view taken along line J-J' illustrated in FIG. 22 according to an embodiment of the present disclosure.

FIG. 22 illustrates an apparatus according to an embodiment of the present disclosure. FIG. 23 is a cross-sectional view taken along line J-J' illustrated in FIG. 22.

With reference to FIGS. 22 and 23, the apparatus according to an embodiment of the present disclosure can include a passive vibration member 100 and one or more vibration generating apparatuses 200.

The apparatus according to an embodiment of the present disclosure can be applied to implement a display apparatus, a sound apparatus, a sound generating apparatus, a sound bar, an analog signage or a digital signage, or the like, but embodiments of the present disclosure are not limited thereto.

The display apparatus can include a display panel, which includes a plurality of pixels for implementing a black/white or color image, and a driver for driving the display panel. For example, the display panel can be a display panel, such as a liquid crystal display panel, an organic light emitting display panel, a light emitting diode display panel, an electrophoresis display panel, an electro-wetting display panel, a micro light emitting diode display panel, or a quantum dot light emitting display panel, or the like, but embodiments of the present disclosure are not limited thereto. For example, in the organic light emitting display panel, a pixel can include an organic light emitting device such as an organic light emitting layer or the like, and the pixel can be a subpixel which implements any one of a plurality of colors configuring a color image. Accordingly, the apparatus according to an embodiment of the present disclosure can include a set electronic apparatus or a set device (or a set apparatus) such as a notebook computer, a television, a computer monitor, an equipment apparatus including an automotive apparatus or another type apparatus for vehicles, or a mobile electronic apparatus such as a smartphone or an electronic pad, or the like, which is a complete product (or a final product) including the display panel such as the liquid crystal display panel or the organic light emitting display panel, or the like.

The analog signage can be an advertising signboard, a sticker, a poster, a noticeboard, or the like. The analog signage can include signage content such as a sentence, a picture, a banner, and a sign, or the like. The signage content can be disposed at the passive vibration member 100 of the apparatus to be visible. For example, the signage content can be directly attached on the passive vibration member 100 and the signage content can be printed or the like on a medium such as paper, and the medium can be attached on the passive vibration member 100.

The passive vibration member 100 can vibrate based on driving (or vibration or displacing) of the one or more vibration generating apparatuses 200. For example, the passive vibration member 100 can generate one or more of a vibration and a sound based on driving of the one or more vibration generating apparatuses 200.

The passive vibration member 100 according to an embodiment of the present disclosure can be a display panel including a display area (or a screen) including a plurality of pixels which implement a black/white or color image. Therefore, the passive vibration member 100 can generate one or more of a vibration and a sound based on driving of the one or more vibration generating apparatuses 200. For example, the passive vibration member 100 can vibrate based on driving of the vibration generating apparatus 200 while displaying an image on the display area, thereby generating or outputting a sound synchronized with the image in the display area. Accordingly, the passive vibration member 100 can be a vibration object, a display member, a display panel, a signage panel, a passive vibration plate, a front cover, a front member, a vibration panel, a sound panel, a passive vibration panel, a sound output plate, a sound vibration plate, or an image screen, or the like, but embodiments of the present disclosure are not limited thereto.

The passive vibration member 100 according to another embodiment of the present disclosure can be a vibration plate which includes a metal material or a nonmetal material (or a composite nonmetal material) having a material characteristic suitable for being vibrated by the one or more vibration generating apparatuses 200 to output sound. For example, the passive vibration member 100 can include a vibration plate which includes one or more materials of metal, plastic, paper, wood, fiber, cloth, leather, glass, rubber, carbon, and a mirror. For example, the paper can be cone for speakers. For example, the cone can be pulp or foamed plastic, or the like, but embodiments of the present disclosure are not limited thereto.

The passive vibration member 100 according to another embodiment of the present disclosure can include a display panel including a pixel which displays an image, or can include a non-display panel. For example, the passive vibration member 100 can include one or more among a display panel including a pixel configured to display an image, a screen panel on which an image is to be projected from a display apparatus, a lighting panel, a signage panel, a vehicular interior material, a vehicular exterior material, a vehicular glass window, a vehicular seat interior material, a building ceiling material, a building interior material, a building glass window, an aircraft interior material, an aircraft glass window, and a mirror, but embodiments of the present disclosure are not limited thereto. For example, the non-display panel can be a light emitting diode lighting panel (or apparatus), an organic light emitting lighting panel (or apparatus), or an inorganic light emitting lighting panel (or apparatus), but embodiments of the present disclosure are not limited thereto.

The one or more vibration generating apparatuses 200 can be configured to vibrate the passive vibration member 100. The one or more vibration generating apparatuses 200 can be configured to be connected to a rear surface 100a of the passive vibration member 100 by a connection member 150. Accordingly, the one or more vibration generating apparatuses 200 can vibrate the passive vibration member 100 to generate or output one or more of a vibration and a sound based on a vibration of the passive vibration member 100.

The one or more vibration generating apparatuses 200 can include one or more of the vibration apparatuses 1 to 7 described above with reference to FIGS. 1 to 21. Accordingly, descriptions of the vibration apparatuses 1 to 7 described above with reference to FIGS. 1 to 21 can be included in descriptions of the vibration generating apparatus 200 illustrated in FIGS. 22 and 23, and thus, like reference numerals refer to like elements and their repetitive descriptions can be omitted.

The connection member 150 can be disposed between the vibration generating apparatus 200 and the passive vibration member 100. The connection member 150 can be disposed between at least a portion of the vibration generating apparatus 200 and the passive vibration member 100. The connection member 150 according to an embodiment of the present disclosure can be connected between the passive vibration member 100 and a center portion, except for a periphery portion, of the vibration generating apparatus 200. For example, the connection member 150 can be connected between the passive vibration member 100 and the center portion of the vibration generating apparatus 200 based on a partial attachment type (or a local bonding method). The center portion (or a central portion) of the vibration generating apparatus 200 can be a center of a vibration, and thus, a vibration of the vibration generating apparatus 200 can be effectively transferred to the passive vibration member 100 through the connection member 150. A periphery portion of the vibration generating apparatus 200 can be spaced apart from each of the connection member 150 and the passive vibration member 100 and lifted without being connected to the connection member 150 and/or the passive vibration member 100, and thus, in a flexural vibration (or a bending vibration) of the vibration generating apparatus 200, a vibration of a periphery portion of the vibration generating apparatus 200 can be prevented (or reduced) by the connection member 150 and/or the passive vibration member 100, whereby a vibration amplitude (or a displacement amplitude) of the vibration generating apparatus 200 can increase. Accordingly, a vibration amplitude (or a displacement amplitude) of the passive vibration member 100 based on a vibration of the vibration generating apparatus 200 can increase, and thus, a sound characteristic and/or a sound pressure level characteristic of a low-pitched sound band generated based on a vibration of the passive vibration member 100 can be more enhanced.

The connection member 150 according to another embodiment of the present disclosure can be connected to or attached on an entire front surface of each of the one or more vibration generating apparatuses 200 and the rear surface 100a of the passive vibration member 100 based on a whole surface attachment type (or an entire surface bonding method).

The connection member 150 according to an embodiment of the present disclosure can include a material including an adhesive layer which is good in adhesive force or attaching force with respect to each of the one or more vibration generating apparatuses 200 and a rear surface of the display panel or a rear surface of the passive vibration member 100. For example, the connection member 150 can include a foam pad, a double-sided tape, or an adhesive, or the like, but embodiments of the present disclosure are not limited thereto. For example, the adhesive layer of the connection member 150 can include epoxy, acrylic, silicone, or urethane, but embodiments of the present disclosure are not limited thereto. For example, the adhesive layer of the connection member 150 can include an acrylic-based material which is relatively greater in adhesive force and hardness than the urethane-based material. Accordingly, a vibration of the one or more vibration generating apparatuses 200 can be well transferred to the vibration plate.

The apparatus according to an embodiment of the present disclosure can further include a supporting member 300 and a coupling member 350.

The supporting member 300 can be disposed at the rear surface 100a of the passive vibration member 100. The supporting member 300 can be disposed at the rear surface 100a of the passive vibration member 100 to cover the one or more vibration generating apparatus 200. The supporting member 300 can be disposed on the rear surface 100a of the passive vibration member 100 to cover all of the rear surface 100a of the passive vibration member 100 and the one or more vibration generating apparatus 200. For example, the supporting member 300 can have the same size as the passive vibration member 100. For example, the supporting member 300 can cover a whole rear surface of the passive vibration member 100 with a gap space GS and the one or more vibration generating apparatus 200 therebetween. The gap space GS can be provided by the coupling member 350 disposed between the passive vibration member 100 and the supporting member 300 facing each other. The gap space GS can be referred to as an air gap, an accommodating space, a vibration space, or a sound sounding box, but embodiments of the present disclosure are not limited thereto.

The supporting member 300 can include any one of a glass material, a metal material, and a plastic material. For example, the supporting member 300 can include a stacked structure in which one or more of a glass material, a plastic material, and a metal material is stacked thereof.

Each of the passive vibration member 100 and the supporting member 300 can have a square shape or a rectangular shape, but embodiments of the present disclosure are not limited thereto, and can have a polygonal shape, a non-polygonal shape, a circular shape, or an oval shape. For example, when the apparatus according to an embodiment of the present disclosure is applied to a sound apparatus or a sound bar, each of the passive vibration member 100 and the supporting member 300 can have a rectangular shape where a length of a long side is twice or more times longer than a short side, but embodiments of the present disclosure are not limited thereto.

The coupling member 350 can be configured to be connected between a rear periphery portion of the passive vibration member 100 and a front periphery portion of the supporting member 300, and thus, the gap space GS can be provided between the passive vibration member 100 and the supporting member 300 facing each other.

The coupling member 350 according to an embodiment of the present disclosure can include an elastic material which has adhesive properties and is capable of compression and decompression. For example, the coupling member 350 can include a double-sided tape, a single-sided tape, a double-sided foam tape, or a double-sided adhesive foam pad, but embodiments of the present disclosure are not limited thereto, and can include an elastic pad such as a rubber pad or a silicone pad, or the like, which has adhesive properties and is capable of compression and decompression. For example, the coupling member 350 can be formed by elastomer.

According to another embodiment of the present disclosure, the supporting member 300 can further include a sidewall portion which supports a rear periphery portion of the passive vibration member 100. The sidewall portion of the supporting member 300 can protrude or be bent toward the rear periphery portion of the passive vibration member 100 from the front periphery portion of the supporting member 300, and thus, the gap space GS can be provided between the passive vibration member 100 and the supporting member 300. For example, the coupling member 350 can be configured to be connected between the sidewall portion of the supporting member 300 and the rear periphery portion of the passive vibration member 100. Accordingly, the supporting member 300 can cover the one or more vibration generating apparatuses 200 and can support the rear surface 100a of the passive vibration member 100. For example, the supporting member 300 can cover the one or more vibration generating apparatuses 200 and can support the rear periphery portion of the passive vibration member 100.

According to another embodiment of the present disclosure, the passive vibration member 100 can further include a sidewall portion which is connected to a front periphery portion of the supporting member 300. The sidewall portion of the passive vibration member 100 can protrude or be bent toward the front periphery portion of the supporting member 300 from the rear periphery portion of the passive vibration member 100, and thus, the gap space GS can be provided between the passive vibration member 100 and the supporting member 300. A stiffness of the passive vibration member 100 can be increased based on the sidewall portion. For example, the coupling member 350 can be configured to be connected between the sidewall portion of the passive vibration member 100 and the front periphery portion of the supporting member 300. Accordingly, the supporting member 300 can cover the one or more vibration generating apparatuses 200 and can support the rear surface 100a of the passive vibration member 100. For example, the supporting member 300 can cover the one or more vibration generating apparatuses 200 and can support the rear periphery portion of the passive vibration member 100.

The apparatus according to an embodiment of the present disclosure can further include one or more enclosure 250.

The enclosure 250 can be connected or coupled to the rear periphery portion of the passive vibration member 100 to individually cover the one or more vibration generating apparatuses 200. For example, the enclosure 250 can be connected or coupled to the rear surface 100a of the passive vibration member 100 by a coupling member 251. The enclosure 250 can configure a closed space which covers or surrounds the vibration apparatus 500, in the rear surface of the supporting member 300. For example, the enclosure 250 can configure a closed space which covers or surrounds the one or more vibration generating apparatuses 200, in the rear surface 100a of the passive vibration member 100. For example, the enclosure 250 can be a closed member, a closed cap, a closed box, or a sound box, but embodiments of the present disclosure are not limited thereto. The closed space can be an air gap, a vibration space, a sound space, or a sounding box, but embodiments of the present disclosure are not limited thereto.

The enclosure 250 can include one or more materials of a metal material and a nonmetal material (or a composite nonmetal material). For example, the enclosure 250 can include one or more materials of a metal material, plastic, and wood, but embodiments of the present disclosure are not limited thereto.

The enclosure 250 according to an embodiment of the present disclosure can maintain an impedance component based on air acting on the passive vibration member 100 when the passive vibration member 100 or the one or more vibration generating apparatuses 200 is vibrating. For example, air around the passive vibration member 100 can resist a vibration of the passive vibration member 100 and can act as an impedance component having a reactance component and a resistance based on a frequency. Therefore, the enclosure 250 can configure a closed space which surrounds the one or more vibration generating apparatuses 200, in the rear surface 100a of the passive vibration member 100, and thus, can maintain an impedance component (or an air impedance or an elastic impedance) acting on the passive vibration member 100 based on air, thereby enhancing a sound characteristic and/or a sound pressure level characteristic of the low-pitched sound band and enhancing the quality of a sound of a high-pitched sound band.

Figure 24:
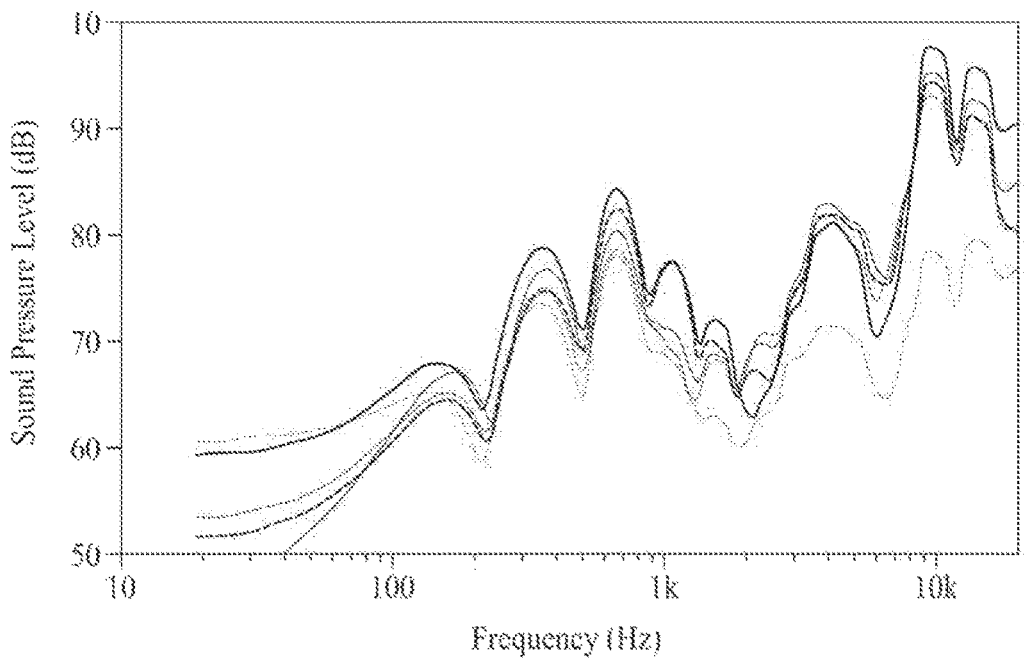
FIG. 24 illustrates a sound output characteristic of the vibration apparatus according to embodiments of the present disclosure.

FIG. 24 illustrates a sound output characteristic of the vibration apparatus according to the first and second embodiments of the present disclosure. In FIG. 24, the abscissa axis (e.g., x-axis) represents a frequency in hertz (Hz), and the ordinate axis (e.g., y-axis) represents a sound pressure level (SPL) in decibels (dB).

In FIG. 24, a thick solid line represents a sound output characteristic when an electrode layer of a vibration portion includes Ag, in the vibration apparatus according to the first embodiment of the present disclosure. A solid line represents a sound output characteristic when an electrode layer of a vibration portion includes carbon and a width of a metal line is set to 15 mm, in the vibration apparatus according to the second embodiment of the present disclosure. A thick dotted line represents a sound output characteristic when the electrode layer of the vibration portion includes carbon and a width of the metal line is set to 10 mm, in the vibration apparatus according to the second embodiment of the present disclosure. A dotted line represents a sound output characteristic when the electrode layer of the vibration portion includes carbon and a width of the metal line is set to 15 mm, in the vibration apparatus according to the second embodiment of the present disclosure. A one-dot-dashed line represents a sound output characteristic when the electrode layer of the vibration portion includes carbon, in the vibration apparatus according to the first embodiment of the present disclosure. A width of a metal line is not limited to embodiments of the present disclosure.

As seen in FIG. 24, in a frequency of 150 Hz to 8 kHz, the thick solid line represents that an average sound pressure level is about 73.87 dB, the solid line represents that an average sound pressure level is about 73.24 dB, the thick dotted line represents that an average sound pressure level is about 73.11 dB, the dotted line represents that an average sound pressure level is about 72.08 dB, and the one-dot-dashed line represents that an average sound pressure level is about 67.72 dB. Also, in a frequency of 150 Hz to 20 kHz, the thick solid line represents that an average sound pressure level is about 77.46 dB, the solid line represents that an average sound pressure level is about 76.38 dB, the thick dotted line represents that an average sound pressure level is about 75.98 dB, the dotted line represents that an average sound pressure level is about 75.06 dB, and the one-dot-dashed line represents that an average sound pressure level is about 69.44 dB.

As seen in FIG. 24, in a vibration apparatus according to an embodiment of the present disclosure, it can be seen that a sound pressure level of 60 dB or more is realized in a pitched sound band of 200 Hz or more. In addition, comparing with the one-dot-dashed line, it can be seen that the average sound pressure level of each of the solid line and the thick dotted line increases to a level similar to the average sound pressure level of the thick solid line.

Accordingly, although an electrode layer includes carbon which is high in resistivity and is relatively low in price, the vibration apparatus according to an embodiment of the present disclosure can output a sound having a sound pressure level of 60 dB or more and can additionally include a metal line, thereby outputting a sound having a sound pressure level of 70 dB or more.

Figure 25:
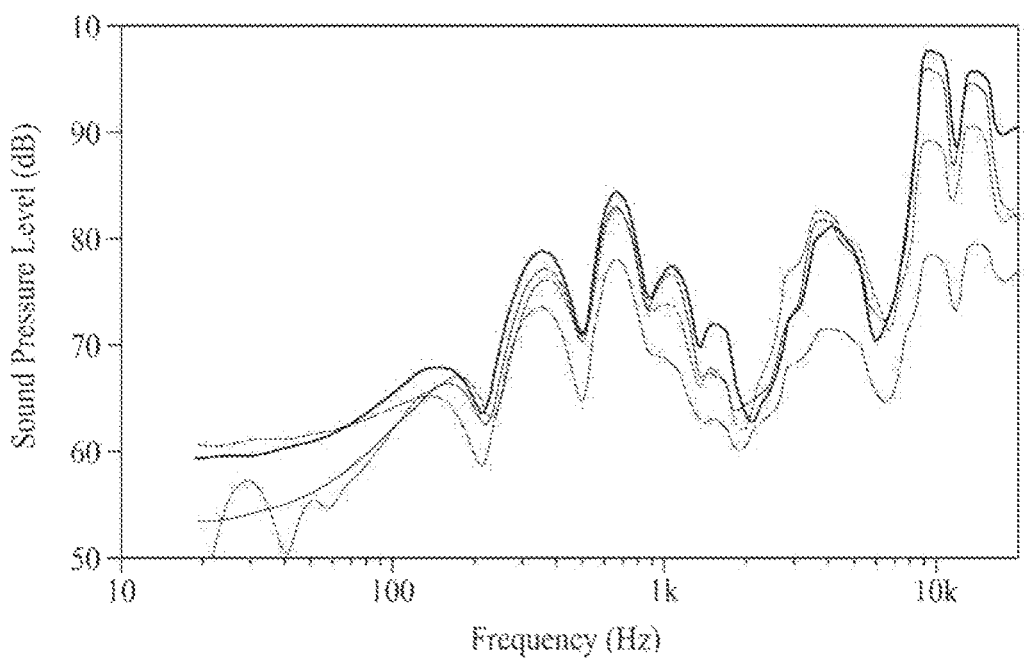
FIG. 25 illustrates another sound output characteristic of the vibration apparatus according to embodiments of the present disclosure.

FIG. 25 illustrates another sound output characteristic of the vibration apparatus according to the first and second embodiments of the present disclosure. In FIG. 25, the abscissa axis (e.g., x-axis) represents a frequency in hertz (Hz), and the ordinate axis (e.g., y-axis) represents a sound pressure level (SPL) in decibels (dB).

In FIG. 25, a thick solid line represents a sound output characteristic when an electrode layer of a vibration portion includes Ag, in the vibration apparatus according to the first embodiment of the present disclosure. A solid line represents a sound output characteristic when an electrode layer of a vibration portion includes carbon and a metal line is provided at a center portion of the vibration portion, in the vibration apparatus according to the second embodiment of the present disclosure. A dotted line represents a sound output characteristic when the electrode layer of the vibration portion includes carbon and the metal line is provided at a periphery portion of the vibration portion, in the vibration apparatus according to the second embodiment of the present disclosure. A one-dot-dashed line represents a sound output characteristic when the electrode layer of the vibration portion includes carbon, in the vibration apparatus according to the first embodiment of the present disclosure.

As seen in FIG. 25, in a frequency of 150 Hz to 8 kHz, the thick solid line represents that an average sound pressure level is about 73.87 dB, the solid line represents that an average sound pressure level is about 72.93 dB, the dotted line represents that an average sound pressure level is about 72.85 dB, and the one-dot-dashed line represents that an average sound pressure level is about 67.72 dB. Also, in a frequency of 150 Hz to 20 kHz, the thick solid line represents that an average sound pressure level is about 77.46 dB, the solid line represents that an average sound pressure level is about 76.20 dB, the dotted line represents that an average sound pressure level is about 75.35 dB, and the one-dot-dashed line represents that an average sound pressure level is about 69.44 dB.

As seen in FIG. 25, in a vibration apparatus according to an embodiment of the present disclosure, it can be seen that a sound pressure level of 60 dB or more is realized in a pitched sound band of 200 Hz or more. In addition, comparing with the one-dot-dashed line, it can be seen that the average sound pressure level of each of the solid line and the thick dotted line increases to a level similar to the average sound pressure level of the thick solid line. And, as in the solid line and the dotted line, it can be seen that a sound pressure level of a high-pitched sound band increases as a metal line is closer from a periphery portion of a vibration portion to a center portion of the vibration portion.

Accordingly, although an electrode layer includes carbon which is high in resistivity and is relatively low in price, the vibration apparatus according to an embodiment of the present disclosure can output a sound having a sound pressure level of 60 dB or more and can additionally include a metal line, thereby outputting a sound having a sound pressure level of 70 dB or more.

The following feature(s) can be generally applicable, i.e. to one or more or all the embodiments of the present technique.

According to the present disclosure, the contact portion 70 or at least a portion of the contact portion 70, which overlaps or is inserted or disposed between the first electrode layer 13 of the vibration portion 10 and the first cover member 30, is relatively thinner than the first signal line 92*a*. In other words, a height or thickness of the contact portion 70, or of the portion of the contact portion 70, is smaller than a height or thickness of the first signal line 92*a*.

Similarly, optionally, the first metal line 33, or at least a portion of the first metal line 33, which overlaps or is inserted or disposed between the first electrode layer 13 of the vibration portion 10 and the first cover member 30 is relatively thinner than the first signal line 92*a*. In other words, a height or thickness of the first metal line 33, or of at least the portion of the first metal line, is smaller than a height or thickness of the first signal line 92*a*.

Similarly, optionally, the (common) contact portion 70 or the first contact member 70A, or at least a portion of the contact portion 70 or of the first contact member 70A, which overlaps or is inserted or disposed between the first electrode layer 13 of the first vibration portion 10A and the first cover member 30 is relatively thinner than the first signal line 92*a*. In other words, a height or thickness of the (common) contact portion 70 or of the first contact member 70A, or at least the portion of the contact portion 70 or of the first contact member 70A, is smaller than a height or thickness of the first signal line 92*a*.

Similarly, optionally, the first metal line 33, or at least a portion of the first metal line 33, which overlaps or is inserted or disposed between the first electrode layer 13 of the first vibration portion 10A and the first cover member 30 is relatively thinner than the first signal line 92*a*. In other words, a height or thickness of the first metal line 33, or of at least the portion of the first metal line 33, is smaller than a height or thickness of the first signal line 92*a*.

Similarly, optionally, the (common) contact portion 70 or the second contact member 70B, or at least a portion of the contact portion 70 or of the second contact member 70B, which overlaps or is inserted or disposed between the first electrode layer 13 of the second vibration portion 10B and the first cover member 30 is relatively thinner than the third signal line 92*c*. In other words, a height or thickness of the (common) contact portion 70 or of the second contact member 70B, or at least a portion of the contact portion 70 or of the second contact member 70B, is smaller than a height or thickness of the third signal line 92*c*.

Similarly, optionally, the third metal line 37, or at least a portion of the third metal line 37, which overlaps or is inserted or disposed between the first electrode layer 13 of the second vibration portion 10B and the first cover member 30 is relatively thinner than the third signal line 92*c*. In other words, a height or thickness of the third metal line 37, or of at least the portion of the third metal line 37, is smaller than a height or thickness of the third signal line 92*c*.

Furthermore, optionally, according to the present disclosure, the second metal line 35, or at least a portion of the second metal line 35, which overlaps or is inserted or disposed between the second electrode layer 15 of the vibration portion 10 or of the first vibration portion 10A and the second cover member 50 is relatively thinner than the second signal line 92*b*. In other words, a height or thickness of the second metal line 35, or of at least the portion of the second metal line, is smaller than a height or thickness of the second signal line 92*b*.

Similarly, according to the present disclosure, the fourth metal line 39, or at least a portion of the fourth metal line 39, which overlaps or is inserted or disposed between the second electrode layer 15 of the second vibration portion 10B and the second cover member 50 is relatively thinner than the fourth signal line 92*d*. In other words, a height or thickness of the fourth metal line 39, or of at least the portion of fourth metal line 39, is smaller than a height or thickness of the fourth signal line 92*d*.

The heights or thicknesses, as mentioned hereinabove, can be measured along a (vertical) direction that extends from the first cover member 30 to the second cover member 50 or vice versa.

The vibration apparatus and the apparatus including the same according to an embodiment of the present disclosure will be described below.

A vibration apparatus according to some embodiments of the present disclosure may comprise a first cover member, a second cover member, a vibration portion between the first cover member and the second cover member, a contact portion between the first cover member and the vibration portion, and a signal cable including a first signal line connected to the a surface of the vibration portion and a second signal line connected to a second surface of the vibration portion opposite to the first surface of the vibration portion.

According to some embodiments of the present disclosure, the vibration portion may comprise a vibration layer including a first electrode layer, and a second electrode layer, a vibration layer between the first electrode layer and the second electrode layer, the vibration layer including a piezoelectric material, the first signal line is configured to be electrically connected to the first electrode layer through the contact portion, and the second signal line is configured to be electrically connected to the second electrode layer.

According to some embodiments of the present disclosure, a first part of the contact portion may overlap with a portion of the first electrode layer.

According to some embodiments of the present disclosure, a first part of the contact portion may be connected to a portion of the first electrode layer, and a second part of the contact portion may be connected to the first signal line.

According to some embodiments of the present disclosure, the first signal line may be connected to the contact portion, and the second signal line may be connected to the second electrode layer.

According to some embodiments of the present disclosure, the vibration apparatus may further comprise a first metal line disposed on the first cover member, the first metal line being connected to the first electrode layer, and a second metal line disposed on the second electrode layer, the first signal line may be electrically connected to the first metal line through the contact portion, and the second signal line may be connected to the second metal line.

According to some embodiments of the present disclosure, the vibration apparatus may further comprise a first metal line at the first cover member, the first metal line being connected to the first electrode layer, and a second metal line at the second cover member, the second metal line being connected to the second electrode layer, the first signal line may be electrically connected to the first metal line through the contact portion, and the second signal line may be connected to the second metal line.

According to some embodiments of the present disclosure, the vibration portion may comprise a first vibration portion and a second vibration portion disposed in parallel with the first vibration portion, and the signal cable may further comprise a third signal line electrically connected to a first surface of the second vibration portion through the contact portion and a fourth signal line connected to a second surface of the second vibration portion opposite to the first surface of the second vibration portion, the first signal line may be electrically connected to a first surface of the first vibration portion through the contact portion, and the second signal line may be electrically connected to a second surface of the first vibration portion opposite to the first surface of the first vibration portion.

According to some embodiments of the present disclosure, each of the first vibration portion and the second vibration portion may comprise a vibration layer including a piezoelectric material, a first electrode layer at the first surface of the vibration layer, and a second electrode layer at a second surface opposite to the first surface of the vibration layer.

According to some embodiments of the present disclosure, the first signal line may be configured to be electrically connected to the first electrode layer of the first vibration portion through the contact portion, the second signal line may be configured to be electrically connected to the second electrode layer of the first vibration portion, the third signal line may be electrically configured to be connected to the first electrode layer of the second vibration portion through the contact portion, and the fourth signal line may be configured to be electrically connected to the second electrode layer of the second vibration portion.

According to some embodiments of the present disclosure, the contact portion may comprise a first contact member connecting the first signal line to the first electrode layer of the first vibration portion, and a second contact member connecting the third signal line to the first electrode layer of the second vibration portion, the first contact member may be spaced apart from the second contact member.

According to some embodiments of the present disclosure, a portion of the first contact member may overlap with the first electrode layer of the first vibration portion, and a portion of the second contact member may overlap with the first electrode layer of the second vibration portion.

According to some embodiments of the present disclosure, the first contact member may be connected to both of the first electrode layer of the first vibration portion and the first signal line, and the second contact member may be connected to both of the first electrode layer of the second vibration portion and the third signal line.

According to some embodiments of the present disclosure, the contact portion may be connected to both of the first electrode layer of the first vibration portion and the first electrode layer of the second vibration portion in common.

According to some embodiments of the present disclosure, the first signal line and the third signal line may be both connected to the contact portion in common.

According to some embodiments of the present disclosure, the vibration apparatus may further comprise a first metal line at the first cover member, the first metal line being connected to the first electrode layer of the first vibration portion, a second metal line at the second electrode layer of the first vibration portion, a third metal line at the first cover member, the third metal line being connected to the first electrode layer of the second vibration portion, and a fourth metal line at the second electrode layer of the second vibration portion.

According to some embodiments of the present disclosure, the contact portion may comprise a first contact member connected to both of the first signal line and the first metal line, and a second contact member connected to both of the third signal line and the third metal line, the second signal line may be connected to the second metal line, the fourth signal line may be connected to the fourth metal line, and the first contact member is spaced apart from the second contact member.

According to some embodiments of the present disclosure, the vibration apparatus may further comprise a first metal line at the first cover member, the first metal line being connected to the first electrode layer of the first vibration portion through the contact portion, a second metal line at the second cover member, the second metal line being connected to the second electrode layer of the first vibration portion, a third metal line at the first cover member, the third metal line being connected to the first electrode layer of the second vibration portion through the contact portion, and a fourth metal line at the second cover member, the fourth metal line being connected to the second electrode layer of the second vibration portion.

According to some embodiments of the present disclosure, the contact portion may comprise a conductive double-sided adhesive member including a metal layer, a first adhesive layer, and a second adhesive layer.

According to some embodiments of the present disclosure, the first and second metal lines may contain silver or copper.

According to some embodiments of the present disclosure, the vibration layer may include a plurality of first portions and a plurality of second portions positioned between adjacent first portions, the plurality of first portions may include an inorganic material including a piezoelectric material, and the plurality of second portions may include an organic material.

According to some embodiments of the present disclosure, the plurality of first portions and the plurality of second portions may be alternately and repeatedly arranged along an edge direction of the vibration layer, a widest second portion, among the plurality of second portions, may be disposed at a center portion of the vibration layer, and a thinnest second portion, among the plurality of second portions, may be disposed at an outer edge of the vibration layer.

According to some embodiments of the present disclosure, the first vibration portion may be spaced apart from the second vibration portion by a distance of about 0.1 mm to 5 mm.

An apparatus according to some embodiments of the present disclosure may comprise a passive vibration member, and a vibration generating apparatus connected to the passive vibration member to vibrate the passive vibration member, the vibration generating apparatus may comprise a vibration apparatus (e.g. as described hereinabove), and the vibration apparatus may comprise a first cover member, a second cover member, a vibration portion between the first cover member and the second cover member, a contact portion between the first cover member and the vibration portion, and a signal cable including a first signal line connected to the a surface of the vibration portion and a second signal line connected to a second surface of the vibration portion opposite to the first surface of the vibration portion.

According to some embodiments of the present disclosure, the contact portion may comprise a conductive double-sided adhesive member including a metal layer, a first adhesive layer, and a second adhesive layer.

According to some embodiments of the present disclosure, the apparatus may further comprise an enclosure disposed at a rear surface of the passive vibration member to cover the vibration generating apparatus.

According to some embodiments of the present disclosure, the passive vibration member can comprise one or more of metal, plastic, wood, paper, fiber, cloth, leather, glass, rubber, carbon, and a mirror.

A vibration apparatus according to an embodiment of the present disclosure can comprise a vibration portion including a first electrode layer, a second electrode layer, and a vibration layer disposed between the first electrode layer and the second electrode layer; a contact portion including a conductive material; and a signal cable including a first signal line electrically connected to the first electrode layer of the vibration portion, and a second signal line electrically connected to the second electrode layer of the vibration portion, the vibration portion can be disposed between the second signal line of the signal cable and the contact portion.

According to some embodiments of the present disclosure, a portion of the second signal line can extend past an end of the first signal line, and the portion of the second signal line can overlap with the vibration portion, and the first signal line can not overlap with the vibration portion.

According to some embodiments of the present disclosure, the vibration apparatus can further comprises a first metal line disposed between the second electrode layer of the vibration portion and the second signal line; and a second metal line connected to the first electrode layer of the vibration portion and the contact portion, the contact portion can be disposed between the second metal line and the first signal line.

According to some embodiments of the present disclosure, the first metal line and the second metal line can extend more than half way across a length of the vibration portion.

According to some embodiments of the present disclosure, the vibration apparatus can further comprise a first cover member, and a second cover member, the vibration portion, the contact portion and the signal cable can be disposed between the first cover member and the second cover member, and the first metal line can contact the first cover member, and the second metal line can contact the second cover member.

According to some embodiments of the present disclosure, the contact portion can contact the first cover member.

According to some embodiments of the present disclosure, the vibration apparatus can further comprise a first cover member, and a second cover member, the vibration portion, the contact portion and the signal cable can disposed between the first cover member and the second cover member.

According to some embodiments of the present disclosure, the contact portion can contact the first cover member.

According to some embodiments of the present disclosure, the passive vibration member can comprise one or more of a display panel including a pixel configured to display an image, a screen panel on which an image is to be projected from a display apparatus, a light emitting diode lighting panel, an organic light emitting lighting panel, an inorganic light emitting lighting panel, a signage panel, a vehicular interior material, a vehicular exterior material, a vehicular glass window, a vehicular seat interior material, a building ceiling material, a building interior material, a building glass window, an aircraft interior material, an aircraft glass window, and a mirror. A vibration apparatus or a vibration generating apparatus according to an embodiment of the present disclosure can be applied to a vibration apparatus or a vibration generating apparatus disposed at an apparatus. The apparatus according to an embodiment of the present disclosure can be applied to mobile apparatuses, video phones, smart watches, watch phones, wearable apparatuses, foldable apparatuses, rollable apparatuses, bendable apparatuses, flexible apparatuses, curved apparatuses, sliding apparatuses, variable apparatuses, electronic organizers, electronic books, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, and home appliances, or the like. In addition, the vibration apparatus or the vibration generating apparatus according to some embodiments of the present disclosure can be applied to organic light-emitting lighting apparatuses or inorganic light-emitting lighting apparatuses. When the vibration apparatus or the vibration generating apparatus of an embodiment of the present disclosure is applied to lighting apparatuses, the vibration apparatus or the vibration generating apparatus can act as lighting and a speaker. Also, when the vibration apparatus or the vibration generating apparatus according to some embodiments of the present disclosure is applied to a mobile device, or the like, the vibration apparatus or the vibration generating apparatus can be one or more of a speaker, a receiver, and a haptic device, but embodiments of the present disclosure are not limited thereto.

It will be apparent to those skilled in the art that various modifications and variations can be made in the present disclosure without departing from the technical idea or scope of the disclosures. Thus, it is intended that the present disclosure covers the modifications and variations of this disclosure provided they come within the scope of the appended claims and their equivalents.

What is claimed is:

1. A vibration apparatus, comprising:
   a first cover member;
   a second cover member;
   a vibration portion between the first cover member and the second cover member;
   a contact portion between the first cover member and the vibration portion; and
   a signal cable including:
      a first signal line connected to a first surface of the vibration portion via the contact portion, and
      a second signal line connected to a second surface of the vibration portion opposite to the first surface of the vibration portion,
   wherein the contact portion includes:
      a metal layer,
      a first tacky layer coupled to a first surface of the metal layer and electrically connected to the first surface of the vibration portion, and
      a second tacky layer coupled to a second surface of the metal layer and the first cover member.

2. The vibration apparatus of claim 1, wherein the vibration portion comprises:
   a first electrode layer;
   a second electrode layer; and
   a vibration layer between the first electrode layer and the second electrode layer, the vibration layer including a piezoelectric material,
   wherein the first signal line is electrically connected to the first electrode layer through the contact portion, and
   wherein the second signal line is electrically connected to the second electrode layer.

3. The vibration apparatus of claim 2, wherein the vibration layer includes a plurality of first portions and a plurality of second portions positioned between adjacent first portions, and
   wherein the plurality of first portions include an inorganic material including a piezoelectric material, and the plurality of second portions include an organic material.

4. The vibration apparatus of claim 3, wherein the plurality of first portions and the plurality of second portions are alternately and repeatedly arranged along an edge direction of the vibration layer,
   wherein a widest second portion, among the plurality of second portions, is disposed at a center portion of the vibration layer, and
   wherein a thinnest second portion, among the plurality of second portions, is disposed at an outer edge of the vibration layer.

5. The vibration apparatus of claim 2, wherein a first part of the contact portion overlaps with a portion of the first electrode layer.

6. The vibration apparatus of claim 5, wherein the first electrode layer contacts a portion of the contact portion thinner than the first signal line.

7. The vibration apparatus of claim 2, wherein a first part of the contact portion is connected to a portion of the first electrode layer, and
   wherein a second part of the contact portion is connected to the first signal line.

8. The vibration apparatus of claim 2, wherein the first signal line is connected to the contact portion, and
   wherein the second signal line is connected to the second electrode layer.

9. The vibration apparatus of claim 2, further comprising:
   a first metal line disposed on the first cover member, the first metal line being connected to the first electrode layer, and
   a second metal line disposed on the second electrode layer,
   wherein the first signal line is electrically connected to the first metal line through the contact portion, and
   wherein the second signal line is electrically connected to the second metal line.

10. The vibration apparatus of claim 9, wherein the first and second metal lines contain silver or copper.

11. The vibration apparatus of claim 2, further comprising:
    a first metal line at the first cover member, the first metal line being connected to the first electrode layer, and
    a second metal line at the second cover member, the second metal line being connected to the second electrode layer,
    wherein the first signal line is electrically connected to the first metal line through the contact portion, and
    wherein the second signal line is electrically connected to the second metal line.

12. The vibration apparatus of claim 1, wherein:
    the vibration portion comprises a first vibration portion and a second vibration portion disposed in parallel with the first vibration portion,
    the signal cable further comprises a third signal line electrically connected to a first surface of the second vibration portion through the contact portion and a fourth signal line connected to a second surface of the second vibration portion opposite to the first surface of the second vibration portion,
    the first signal line is electrically connected to a first surface of the first vibration portion through the contact portion, and
    the second signal line is connected to a second surface of the first vibration portion opposite to the first surface of the first vibration portion.

13. The vibration apparatus of claim 12, wherein each of the first vibration portion and the second vibration portion comprises:
    a vibration layer including a piezoelectric material;
    a first electrode layer at the first surface of the vibration layer; and
    a second electrode layer at a second surface opposite to the first surface of the vibration layer.

14. The vibration apparatus of claim 13, wherein:
    the first signal line is electrically connected to the first electrode layer of the first vibration portion through the contact portion,
    the second signal line is electrically connected to the second electrode layer of the first vibration portion,
    the third signal line is electrically connected to the first electrode layer of the second vibration portion through the contact portion, and
    the fourth signal line is electrically connected to the second electrode layer of the second vibration portion.

15. The vibration apparatus of claim 13, wherein the contact portion comprises:
    a first contact member connecting the first signal line to the first electrode layer of the first vibration portion, and
    a second contact member connecting the third signal line to the first electrode layer of the second vibration portion, wherein each of the first contact member and the second contact member includes the metal layer, the first tacky layer, and the second tacky layer, and wherein the first contact member is spaced apart from the second contact member.

16. The vibration apparatus of claim 15, wherein a portion of the first contact member overlaps with the first electrode layer of the first vibration portion, and wherein a portion of the second contact member overlaps with the first electrode layer of the second vibration portion.

17. The vibration apparatus of claim 15, wherein the first contact member is connected to both of the first electrode layer of the first vibration portion and the first signal line, and wherein the second contact member is connected to both of the first electrode layer of the second vibration portion and the third signal line.

18. The vibration apparatus of claim 13, wherein the contact portion is connected to both of the first electrode layer of the first vibration portion and the first electrode layer of the second vibration portion in common.

19. The vibration apparatus of claim 18, wherein the first signal line and the third signal line are both connected to the contact portion in common.

20. The vibration apparatus of claim 13, further comprising:

a first metal line at the first cover member, the first metal line being connected to the first electrode layer of the first vibration portion;

a second metal line at the second electrode layer of the first vibration portion;

a third metal line at the first cover member, the third metal line being connected to the first electrode layer of the second vibration portion; and a fourth metal line at the second electrode layer of the second vibration portion.

21. The vibration apparatus of claim 20, wherein the contact portion comprises:

a first contact member connected to both of the first signal line and the first metal line, and a second contact member connected to both of the third signal line and the third metal line, wherein each of the first contact member and the second contact member includes the metal layer, the first tacky layer, and the second tacky layer, wherein the second signal line is connected to the second metal line, wherein the fourth signal line is connected to the fourth metal line, and wherein the first contact member is spaced apart from the second contact member.

22. The vibration apparatus of claim 13, further comprising:

a first metal line at the first cover member, the first metal line being connected to the first electrode layer of the first vibration portion;

a second metal line at the second cover member, the second metal line being connected to the second electrode layer of the first vibration portion;

a third metal line at the first cover member, the third metal line being connected to the first electrode layer of the second vibration portion; and a fourth metal line at the second cover member, the fourth metal line being connected to the second electrode layer of the second vibration portion.

23. The vibration apparatus of claim 1, wherein the contact portion comprises a conductive double-sided adhesive member including the metal layer, the first tacky layer, and the second tacky layer.

24. The vibration apparatus of claim 1, wherein the vibration portion comprises a first vibration portion and a second vibration portion disposed in parallel with the first vibration portion, and wherein the first vibration portion is spaced apart from the second vibration portion by a distance of about 0.1 mm to 5 mm.

25. An apparatus for generating vibration or sound, the apparatus comprising:

a passive vibration member; and a vibration generating apparatus connected to the passive vibration member to vibrate the passive vibration member, wherein the vibration generating apparatus comprises the vibration apparatus of claim 1.

26. The apparatus of claim 25, wherein the contact portion comprises a conductive double-sided adhesive member including the metal layer, the first tacky layer, and the second tacky layer.

27. The apparatus of claim 25, further comprising an enclosure disposed at a rear surface of the passive vibration member to cover the vibration generating apparatus.

28. The apparatus of claim 25, wherein the passive vibration member comprises one or more of metal, plastic, wood, paper, fiber, cloth, leather, glass, rubber, carbon, and a mirror.

29. The apparatus of claim 25, wherein the passive vibration member comprises one or more of a display panel including a pixel configured to display an image, a screen panel on which an image is to be projected from a display apparatus, a light emitting diode lighting panel, an organic light emitting lighting panel, an inorganic light emitting lighting panel, a signage panel, a vehicular interior material, a vehicular exterior material, a vehicular glass window, a vehicular seat interior material, a building ceiling material, a building interior material, a building glass window, an aircraft interior material, an aircraft glass window, and a mirror.

30. A vibration apparatus, comprising:

a first cover member;

a second cover member;

a vibration portion between the first cover member and the second cover member, the vibration portion including a first electrode layer, a second electrode layer, and a vibration layer disposed between the first electrode layer and the second electrode layer;

a contact portion including a conductive material; and a signal cable including:

a first signal line electrically connected to the first electrode layer of the vibration portion via the contact portion, and a second signal line electrically connected to the second electrode layer of the vibration portion, wherein the vibration portion is disposed between the second signal line of the signal cable and the contact portion, and wherein the contact portion includes:

a metal layer, a first tacky layer coupled to a first surface of the metal layer and electrically connected to the first electrode layer of the vibration portion, and a second tacky layer coupled to a second surface of the metal layer and the first cover member.

31. The vibration apparatus of claim 30, wherein a portion of the second signal line extends past an end of the first signal line, and the portion of the second signal line overlaps with the vibration portion, and
- wherein the first signal line does not overlap with the vibration portion.

32. The vibration apparatus of claim 30, further comprising:
- a first metal line disposed between the second electrode layer of the vibration portion and the second signal line; and
- a second metal line connected to the first electrode layer of the vibration portion and the contact portion,
- wherein the second tacky layer of the contact portion is connected to the second metal line; and
- wherein the first tacky layer of the contact portion is connected to the first signal line.

33. The vibration apparatus of claim 32, wherein the first metal line and the second metal line extend more than half way across a length of the vibration portion.

34. The vibration apparatus of claim 32,
- wherein the vibration portion, the contact portion and the signal cable are disposed between the first cover member and the second cover member, and
- wherein the first metal line contacts the first cover member, and the second metal line contacts the second cover member.

35. The vibration apparatus of claim 30,
- wherein the vibration portion, the contact portion and the signal cable are disposed between the first cover member and the second cover member.

\* \* \* \* \*